United States Patent
Cai et al.

(10) Patent No.: US 12,262,608 B2
(45) Date of Patent: Mar. 25, 2025

(54) DISPLAY SUBSTRATE HAVING BEZEL REGION AT PERIPHERY OF FIRST DISPLAY REGION AND SECOND DISPLAY REGION AND PREPARATION METHOD THEREOF, AND DISPLAY APPARATUS HAVING THE SAME

(71) Applicants: Chengdu BOE Optoelectronics Technology Co., Ltd., Sichuan (CN); BOE Technology Group Co., Ltd., Beijing (CN)

(72) Inventors: Jianchang Cai, Beijing (CN); Chi Yu, Beijing (CN); Bo Shi, Beijing (CN); Yudiao Cheng, Beijing (CN); Zhi Wang, Beijing (CN); Benlian Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/780,999

(22) PCT Filed: Jun. 23, 2021

(86) PCT No.: PCT/CN2021/101880
§ 371 (c)(1),
(2) Date: May 30, 2022

(87) PCT Pub. No.: WO2022/266896
PCT Pub. Date: Dec. 29, 2022

(65) Prior Publication Data
US 2024/0164156 A1    May 16, 2024

(51) Int. Cl.
*H10K 59/131* (2023.01)
*H10K 59/12* (2023.01)
*H10K 59/121* (2023.01)

(52) U.S. Cl.
CPC ....... *H10K 59/131* (2023.02); *H10K 59/1201* (2023.02); *H10K 59/1213* (2023.02); *H10K 59/1216* (2023.02)

(58) Field of Classification Search
CPC ............. H01K 59/131; H10K 59/1201; H10K 59/1213; H10K 59/1216
See application file for complete search history.

(56) References Cited

U.S. PATENT DOCUMENTS

2018/0366495 A1    12/2018 Xu et al.
2020/0098843 A1*    3/2020 Jeon .................... H10K 59/131
(Continued)

FOREIGN PATENT DOCUMENTS

CN    107870492 A    4/2018
CN    109801947 A    5/2019
(Continued)

*Primary Examiner* — Michael Jung
(74) *Attorney, Agent, or Firm* — Ling Wu; Stephen Yang; Ling and Yang Intellectual Property

(57) ABSTRACT

Disclosed is a display substrate including a base substrate, which includes first and second display regions, and at least one first data line. The first display region includes first and second sub-display regions located on opposite sides of the second display region along a first direction and a third sub-display region located on at least one side of the second display region along a second direction. The first data line includes a first sub-data line located in the first sub-display region and connected with a pixel circuit of the first sub-display region, a second sub-data line located in the second sub-display region and connected with a pixel circuit of the second sub-display region, and a third sub-data line which is connected with the first and second sub-data lines, located in (Continued)

the third sub-display region, and connected with at least one second pixel circuit of the third sub-display region.

18 Claims, 21 Drawing Sheets

(56) References Cited

U.S. PATENT DOCUMENTS

| | | |
|---|---|---|
| 2021/0013298 A1 | 1/2021 | Her et al. |
| 2021/0032156 A1* | 2/2021 | Hwang ............... H10K 59/8792 |
| 2021/0193773 A1* | 6/2021 | Park ....................... H10K 71/00 |
| 2021/0265430 A1 | 8/2021 | Chang et al. |
| 2022/0069047 A1 | 3/2022 | Yang et al. |
| 2022/0310010 A1 | 9/2022 | Cheng et al. |

FOREIGN PATENT DOCUMENTS

| | | |
|---|---|---|
| CN | 111128080 A | 5/2020 |
| CN | 111180483 A | 5/2020 |
| CN | 111613658 A | 9/2020 |
| CN | 111916486 A | 11/2020 |
| CN | 111951687 A | 11/2020 |
| CN | 111969027 A | 11/2020 |
| CN | 112071882 A | 12/2020 |

* cited by examiner

DISPLAY SUBSTRATE HAVING BEZEL REGION AT PERIPHERY OF FIRST DISPLAY REGION AND SECOND DISPLAY REGION AND PREPARATION METHOD THEREOF, AND DISPLAY APPARATUS HAVING THE SAME

CROSS-REFERENCE TO RELATED APPLICATION

The present application is a U.S. National Phase Entry of International Application No. PCT/CN2021/101880 having an international filing date of Jun. 23, 2021. The entire content of the above-identified application is hereby incorporated by reference.

TECHNICAL FIELD

The present disclosure relates to, but is not limited to, the field of display technologies, and particularly to a display substrate, a preparation method thereof, and a display apparatus.

BACKGROUND

An Organic Light Emitting Diode (OLED) is an active light emitting display device, which has advantages such as self-luminescence, a wide angle of view, a high contrast ratio, low power consumption, an extremely high response speed, lightness and thinness, flexibility, and a low cost. With continuous development of display technologies, a flexible display apparatus (Flexible Display) with an OLED as a light emitting device and a Thin Film Transistor (TFT) for performing signal controlling has become a mainstream product in a current display field.

An under display camera technology is a brand-new technology proposed to increase a screen-to-body ratio of a display apparatus.

SUMMARY

The following is a summary of subject matters described herein in detail. The summary is not intended to limit the scope of protection of claims.

Embodiments of the present disclosure provide a display substrate, a preparation method thereof, and a display apparatus.

In one aspect, an embodiment of the present disclosure provides a display substrate including a base substrate, multiple pixel circuits, multiple first light emitting elements, and at least one first data line. The base substrate includes a first display region and a second display region, wherein the first display region at least partially surrounds the second display region. The first display region includes: a first sub-display region and a second sub-display region located on opposite sides of the second display region along a first direction, and a third sub-display region located on at least one side of the second display region along a second direction, wherein the first direction intersects the second direction. The multiple pixel circuits and the multiple first light emitting elements are located in the first display region; the multiple pixel circuits include multiple first pixel circuits and multiple second pixel circuits, the multiple second pixel circuits are distributed among the multiple first pixel circuits; and at least one pixel circuit of the multiple first pixel circuits is connected with at least one light emitting element of the multiple first light emitting elements. The at least one first data line is located in the first display region; the first data line includes a first sub-data line, a second sub-data line, and a third sub-data line; wherein the third sub-data line is connected with the first sub-data line and the second sub-data line. The first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region.

In some exemplary embodiments, the first sub-data line and the second sub-data line each extend along the first direction.

In some exemplary embodiments, the third sub-data line at least includes: a first line segment and a second line segment, the first line segment extends along the second direction, and the second line segment extends along the first direction. One end of the first line segment extends to the first sub-display region and is connected with the first sub-data line, and the other end of the first line segment is connected with the second line segment. The second line segment is connected with at least one second pixel circuit of the third sub-display region.

In some exemplary embodiments, the first sub-data line, the second sub-data line, and a second line segment of the third sub-data line are of a same-layer structure, and the first line segment and the second line segment of the third sub-data line are of a different-layer structure.

In some exemplary embodiments, the first sub-data line and the second sub-data line are of a same-layer structure, and the third sub-data line and the first sub-data line are of a different-layer structure.

In some exemplary embodiments, the base substrate further includes a bezel region located at a periphery of the first display region and the second display region. The bezel region is provided with at least one data connection line, and the data connection line is connected between the third sub-data line and the second sub-data line.

In some exemplary embodiments, the data connection line at least includes: a first sub-data connection line, a second sub-data connection line, and a third sub-data connection line. The second sub-data connection line is connected between the first sub-data connection line and the third sub-data connection line, the first sub-data connection line is connected with the third sub-data line, and the third sub-data connection line is connected with the second sub-data line.

In some exemplary embodiments, the first sub-data connection line and the third sub-data connection line extend along the first direction and the second sub-data connection line extends along the second direction.

In some exemplary embodiments, the first sub-data connection line and the third sub-data connection line are of a same-layer structure, and the first sub-data connection line and the second sub-data connection line are of a different-layer structure.

In some exemplary embodiments, the second sub-data connection line, and the first sub-data line and the second sub-data line are of a same-layer structure.

In some exemplary embodiments, the display substrate further includes multiple second light emitting elements located in the second display region; and at least one pixel circuit of the multiple second pixel circuits is connected with at least one light emitting element of the multiple second light emitting elements through a conductive line.

In some exemplary embodiments, in a plane perpendicular to a display substrate, the display substrate at least includes a semiconductor layer, a first conductive layer, a second conductive layer, and a third conductive layer, and a fourth conductive layer that are disposed on the base substrate. The semiconductor layer at least includes active layers of multiple transistors of a pixel circuit. The first conductive layer at least includes gates of the multiple transistors and a first electrode of a storage capacitor of the pixel circuit. The second conductive layer at least includes a second electrode of the storage capacitor of the pixel circuit. The third conductive layer at least includes a first power supply line. The fourth conductive layer at least includes a first connection electrode connecting the pixel circuit and a light emitting element.

In some exemplary embodiments, the first sub-data line, the second sub-data line, and a second line segment of the third sub-data line are located in the third conductive layer, and a first line segment of the third sub-data line is located in the fourth conductive layer; or, the first sub-data line and the second sub-data line are located in the third conductive layer, and the third sub-data line is located in the fourth conductive layer.

In another aspect, an embodiment of the present disclosure provides a display apparatus, which includes the aforementioned display substrate.

In another aspect, an embodiment of the disclosure provides a preparation method of a display substrate, which includes: forming multiple pixel circuits, multiple first light emitting elements, and at least one first data line in a first display region of a base substrate. The first display region at least partially surrounds the second display region. The first display region includes: a first sub-display region and a second sub-display region located on opposite sides of the second display region along a first direction, and a third sub-display region located on at least one side of the second display region along a second direction, wherein the first direction intersects the second direction. The multiple pixel circuits include multiple first pixel circuits and multiple second pixel circuits, wherein the multiple second pixel circuits are distributed among the multiple first pixel circuits; at least one pixel circuit of the multiple first pixel circuits is connected with at least one light emitting element of the multiple first light emitting elements. The first data line includes a first sub-data line, a second sub-data line, and a third sub-data line; wherein the third sub-data line is connected with the first sub-data line and the second sub-data line. The first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region.

Other aspects may be understood upon reading and understanding of the accompanying drawings and detailed descriptions.

BRIEF DESCRIPTION OF DRAWINGS

The drawings provide a further understanding to technical solutions of the present disclosure, form a part of the specification, and are adopted to explain, together with the embodiments of the present disclosure, the technical solutions of the present disclosure and not intended to form a limitation to the technical solutions of the present disclosure. Shapes and sizes of one or more components in the drawings do not reflect true scales, and are only intended to schematically describe contents of the present disclosure.

DETAILED DESCRIPTION

Figure 1:
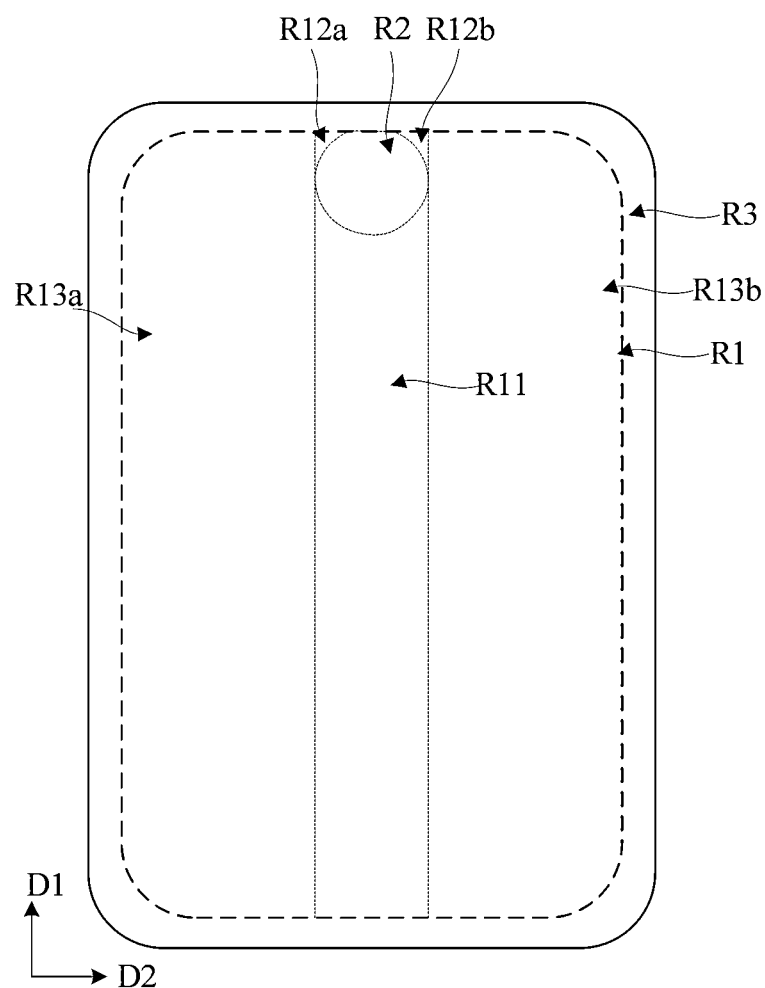
FIG. 1 is a schematic diagram of a display substrate according to at least one embodiment of the present disclosure.

The embodiments of the present disclosure will be described below in combination with the drawings in detail. Implementation modes may be implemented in multiple different forms. Those of ordinary skill in the art may easily understand such a fact that manners and contents may be transformed into other forms without departing from the purpose and scope of the present disclosure. Therefore, the present disclosure should not be construed as being only limited to the contents recorded in the following implementation modes. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically show ideal examples, and one mode of the present disclosure is not limited to a shape, a numerical value, or the like shown in the drawings.

Ordinal numerals such as "first", "second", and "third" in the specification are set to avoid confusion of constituent elements, but not to set a limit in quantity. In the present disclosure, "multiple" represents two or more than two.

In the specification, for convenience, wordings indicating orientations or positional relationships, such as "center", "upper", "lower", "front", "back", "vertical", "horizontal", "top", "bottom", "inside", and "outside", are used for describing positional relationships between constituent elements with reference to the drawings, and are merely for facilitating describing the specification and simplifying the description, rather than indicating or implying that referred apparatuses or elements must have particular orientations, or be constructed and operated in particular orientations. Thus, they cannot be construed as limitations on the present disclosure. The positional relationships between the constituent elements are changed as appropriate according to a direction where the constituent elements are described. Therefore, they are not limited to the wordings described in the specification, which may be replaced appropriately according to situations.

In the specification, unless otherwise specified and defined explicitly, terms "mounted", "mutually connected", and "connection" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above terms in the present disclosure according to situations.

In the specification, a transistor refers to an element which at least includes three terminals, i.e., a gate, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in the specification.

In the specification, a "connection" includes a situation in which constituent element are connected with each other through an element having some electrical function. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with multiple functions, etc.

In the specification, "parallel" refers to a state in which an angle formed by two straight lines is −10° or more and 100 or less, and thus also includes a state in which the angle is −5° or more and 5° or less. In addition, "perpendicular" refers to a state in which an angle formed by two straight lines is 800 or more and 1000 or less, and thus also includes a state in which the angle is 850 or more and 950 or less.

In the present disclosure, "about" refers to that a boundary is defined not so strictly and numerical values within process and measurement error ranges are allowed.

At least one embodiment of the present disclosure provides a display substrate, including a base substrate, multiple pixel circuits, multiple first light emitting elements, and at least one first data line. The base substrate includes a first display region and a second display region. The first display region at least partially surrounds the second display region. The first display region includes: a first sub-display region and a second sub-display region located on opposite sides of the second display region along a first direction, and a third sub-display region located on at least one side of the second display region along a second direction. The first direction and the second direction intersect. The multiple pixel circuits and the multiple first light emitting elements are located in the first display region. The multiple pixel circuits include multiple first pixel circuits and multiple second pixel circuits, wherein the multiple second pixel circuits are distributed among the multiple first pixel circuits. At least one pixel circuit of the multiple first pixel circuits is connected with at least one light emitting element of the multiple first light emitting elements. The at least one first data line is located in the first display region. The first data line includes a first sub-data line, a second sub-data line, and a third sub-data line, and the third sub-data line is connected with the first sub-data line and the second sub-data line. The first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region.

In some examples, the multiple second pixel circuits are distributed among the multiple first pixel circuits, which may include: multiple first pixel circuits are arranged between two adjacent second pixel circuits in the second direction. The multiple second pixel circuits may be sequentially arranged in the first direction. However, this embodiment is not limited thereto.

In some examples, the first sub-display region is provided with multiple first pixel circuits, the second sub-display region is provided with multiple first pixel circuits, and the third sub-display region is provided with multiple first pixel circuits and multiple second pixel circuits. The first sub-data line of the first data line is connected with at least one first pixel circuit of the first sub-display region, the second sub-data line is connected with at least one first pixel circuit of the second sub-display region, and the third sub-data line is connected with at least one second pixel circuit of the third sub-display region. In other examples, the first sub-display region is provided with multiple first pixel circuits, the second sub-display region is provided with multiple first pixel circuits and multiple second pixel circuits, and the third sub-display region is provided with multiple first pixel circuits and multiple second pixel circuits. The first sub-data line of the first data line is connected with at least one first pixel circuit of the first sub-display region, the second sub-data line is connected with at least one first pixel circuit or at least one second pixel circuit of the second sub-display region, and the third sub-data line is connected with at least one second pixel circuit of the third sub-display region. In other examples, the first sub-display region is provided with multiple first pixel circuits and multiple second pixel circuits, the second sub-display region is provided with multiple first pixel circuits and multiple second pixel circuits, and the third sub-display region is provided with multiple first pixel circuits and multiple second pixel circuits. The first sub-data line of the first data line is connected with at least one first or second pixel circuit of the first sub-display region, the second sub-data line is connected with at least one first or second pixel circuit of the second sub-display region, and the third sub-data line is connected with at least one second pixel circuit of the third sub-display region. However, this embodiment is not limited thereto.

In some examples, the first direction is parallel to a sub-pixel column direction in a display region and the second direction is parallel to a sub-pixel row direction in the display region. The first direction is perpendicular to the second direction.

According to the display substrate provided by the embodiment, the second display region separates the first sub-display region and the second sub-display region in the first direction. A connection between the first sub-data line of the first sub-display region and the second sub-data line of the second sub-display region is achieved by providing the third sub-data line in the third sub-display region, so that transmission of data signals may be achieved, an influence on a light transmittance of the second display region caused by a wiring in the second display region is avoided, thereby improving a display effect.

In some exemplary embodiments, both the first sub-data line and the second sub-data line extend along the first direction. For example, extension lines of a first sub-data line and a second sub-data line that are included in one first data line may be overlapped. However, this embodiment is not limited thereto.

In some exemplary embodiments, the third sub-data line at least includes: a first line segment extending along the second direction and a second line segment extending along the first direction. One end of the first line segment extends to the first sub-display region and is connected with the first sub-data line, and the other end of the first line segment is connected with the second line segment. The second line segment is connected with at least one second pixel circuit of the third sub-display region. However, this embodiment is not limited thereto. In some examples, the third sub-data line may include a first line segment, a second line segment, and a third line segment; the first line segment and the third line segment extend along the second direction, and the second line segment extends along the first direction. One end of the first line segment extends to the first sub-display region and is connected with the first sub-data line, and the other end of the first line segment is connected with the second line segment in the third sub-display region. One end of the third line segment extends to the second sub-display region and is connected with the second sub-data line, and the other end of the third line segment is connected with the second line segment in the third sub-display region.

In some exemplary embodiments, the first sub-data line, the second sub-data line, and the second line segment of the third sub-data line may be of a same-layer structure, and the first line segment and the second line segment of the third sub-data line may be of a different-layer structure. However, this embodiment is not limited thereto.

In some exemplary embodiments, the first sub-data line and the second sub-data line may be of a same-layer structure, and the third sub-data line and the first sub-data line may be of a different-layer structure. In some examples, the first line segment and the second line segment of the third sub-data line may be of a same-layer structure. However, this embodiment is not limited thereto.

In some exemplary embodiments, the base substrate further includes a bezel region. The bezel region is located at a periphery of the first display region and the second display region. The bezel region is provided with at least one data connection line, and the data connection line is connected between the third sub-data line and the second sub-data line. In an exemplary embodiment, a connection between the third sub-data line and the second sub-data line is achieved by providing a data connection line in the bezel region. However, this embodiment is not limited thereto.

In some exemplary embodiments, the data connection line at least includes: a first sub-data connection line, a second sub-data connection line, and a third sub-data connection line. The second sub-data connection line is connected between the first sub-data connection line and the third sub-data connection line, the first sub-data connection line is connected with the third sub-data line, and the third sub-data connection line is connected with the second sub-data line. In this example, the data connection line includes multiple sub-data connection lines sequentially connected.

In some exemplary embodiments, the first and third sub-data connection lines extend along the first direction and the second sub-data connection line extends along the second direction.

In some exemplary embodiments, the first sub-data connection line and the third sub-data connection line are of a same-layer structure, and the first sub-data connection line and the second sub-data connection line are of a different-layer structure. However, this embodiment is not limited thereto. For example, the first sub-data connection line, the second sub-data connection line, and the third sub-data connection line may be of an integral structure.

In some exemplary embodiments, the second sub-data connection line, and the first sub-data line and the second sub-data line are of a same-layer structure. However, this embodiment is not limited thereto.

In some exemplary embodiments, the display substrate further includes multiple second light emitting elements located in the second display region. At least one pixel circuit of the multiple second pixel circuits is connected with at least one light emitting element of the multiple second light emitting elements through a conductive line.

In some exemplary embodiments, in a plane perpendicular to the display substrate, the display substrate at least includes a semiconductor layer, a first conductive layer, a second conductive layer, and a third conductive layer, and a fourth conductive layer disposed on the base substrate. The semiconductor layer at least includes active layers of multiple transistors of a pixel circuit. The first conductive layer at least includes gates of the multiple transistors of the pixel circuit and a first electrode of a storage capacitor. The second conductive layer at least includes a second electrode of the storage capacitor. The third conductive layer at least includes a first power supply line. The fourth conductive layer at least includes a first connection electrode connecting the pixel circuit and a light emitting element. In some examples, the pixel circuit may be of a 7T1C structure. However, this embodiment is not limited thereto.

In some exemplary embodiments, the first sub-data line, the second sub-data line, and the second line segment of the third sub-data line are located in the third conductive layer, and the first line segment of the third sub-data line is located in the fourth conductive layer. Or, the first sub-data line and the second sub-data line are located in the third conductive layer, and the third sub-data line is located in the fourth conductive layer. However, this embodiment is not limited thereto.

The display substrate of this embodiment will be described through several examples.

FIG. 1 is a schematic diagram of a display substrate according to at least one embodiment of the present disclosure. In some exemplary embodiments, as shown in FIG. 1, the base substrate of the display substrate includes a display region and a bezel region R3 located at a periphery of the display region. The bezel region R3 surrounds the display region. The display region includes a first display region R1 and a second display region R2, and the first display region R1 at least partially surrounds the second display region R2. For example, the second display region R2 shown in FIG. 1 is located at a top middle position of the display substrate, and one side of the second display region R2 is adjacent to the bezel region R3. However, this embodiment is not limited thereto. For example, the second display region R2 may be located at another position such as an upper left corner position or an upper right corner position of the display substrate.

In some exemplary embodiments, as shown in FIG. 1, the display region may be of a shape of a rectangle, e.g., a rectangle with rounded corners. The second display region R2 may be circular. However, this embodiment is not limited thereto. For example the second display region R2 may be of a shape of a rectangle, an ellipse, or the like.

In some exemplary embodiments, the first display region R1 may be a non-light-transmissive display region and the second display region R2 may be a light-transmissive display region. That is, the first display region R1 is non-light-transmissive and the second display region R2 is light-transmissive. For example, an orthographic projection of hardware such as a photosensitive sensor (such as a camera) on the display substrate may be located in the second display region R2 of the display substrate. In this example, the display substrate does not need to be punched, and under a premise of ensuring practicability of the display substrate, it is possible to achieve a true full screen.

In some exemplary embodiments, as shown in FIG. 1, the first display region R1 includes: a first sub-display region R11 and a second sub-display region located on opposite sides of the second display region R2 in a first direction D1, and a third sub-display region located on opposite sides of the second display region R2 in a second direction D2. The second sub-display region includes a second sub-display first sub-region R12a and a second sub-display second sub-region R12b, and the third sub-display region includes a third sub-display first sub-region R13a and a third sub-display second sub-region R13b. The first sub-display region R11 is located on a lower side of the second display region R2, and the second sub-display region is located on an upper side of the second display region R2. The first sub-display region R11 and the second sub-display region are separated by the second display region R2 in the first direction D1, and the second sub-display region is separated by the second display region R2 in the second direction D2. That is, the second sub-display first sub-region R12a and the second sub-display second sub-region R12b are located on opposite sides of the second display region R2 in the second direction D2. However, this embodiment is not limited thereto. For example, the second sub-display first sub-region R12a and the second sub-display second sub-region R12b may communicate in the second direction D2. The third sub-display first sub-region R13a is located on a left side of the second display region R2, and the third sub-display second sub-region R13b is located on a right side of the second display region R2. The third sub-display first sub-region R13a and the third sub-display second sub-region R13b are separated by the first sub-display region R11, the second sub-display region R2, and the second sub-display region. The third sub-display first sub-region R13a communicates with the first sub-display region R11 and the second sub-display first sub-region R12a, and the third sub-display second sub-region R13b communicates with the first sub-display region R11 and the second sub-display second sub-region R12b. The first direction D1 intersects with the second direction D2, for example, the first direction D1 is perpendicular to the second direction D2. In some examples, the first direction D1 is parallel to a sub-pixel column direction and the second direction D2 is parallel to a sub-pixel row direction. However, this embodiment is not limited thereto.

In some exemplary embodiments, the display substrate may include multiple sub-pixels disposed on the base substrate. At least one sub-pixel includes a pixel circuit and a light emitting element. The pixel circuit is configured to drive the light emitting element. For example, the pixel circuit is configured to provide a drive current to drive the light emitting element to emit light. For example, the light emitting element may be an Organic Light Emitting Diode (OLED), and the light emitting element emits red light, green light, blue light, or white light, etc. under drive of its corresponding pixel circuit. A color of light emitted from the light emitting element may be determined as required. In some examples, the light emitting element may include a first electrode (e.g. an anode), a second electrode (e.g. a cathode) and an organic light emitting layer disposed between the first and second electrodes. The first electrode may be connected with the pixel circuit. However, this embodiment is not limited thereto. In some examples, the light emitting element may be a Quantum Dot Light Emitting Diode (QLED), a Micro Light Emitting Diode (Micro-LED), or a Mini Diode (Mini-LED).

In some exemplary embodiments, a pixel unit may include three sub-pixels (for example, a red sub-pixel R, a blue sub-pixel B, and a green sub-pixel G), and the three sub-pixels may be arranged horizontally, vertically, or in a manner like a Chinese character "a". For example, a pixel unit may include four sub-pixels (a red sub-pixel R, a blue sub-pixel B, a green sub-pixel G, and a white sub-pixel), and the four sub-pixels may be arranged horizontally, vertically, or in a manner to form a square. However, the embodiment of the present disclosure is not limited to this.

In some exemplary embodiments, in order to improve a light transmittance of the second display region R2, it is possible to arrange only a light emitting element in the second display region R2, and arrange a pixel circuit for driving the light emitting element of the second display region R2 in the first display region R1. That is, the light transmittance of the second display region R2 is improved by separately arranging the light emitting element and the pixel circuit. In this example, in the second display region R2, no pixel circuit is provided.

Figure 2:
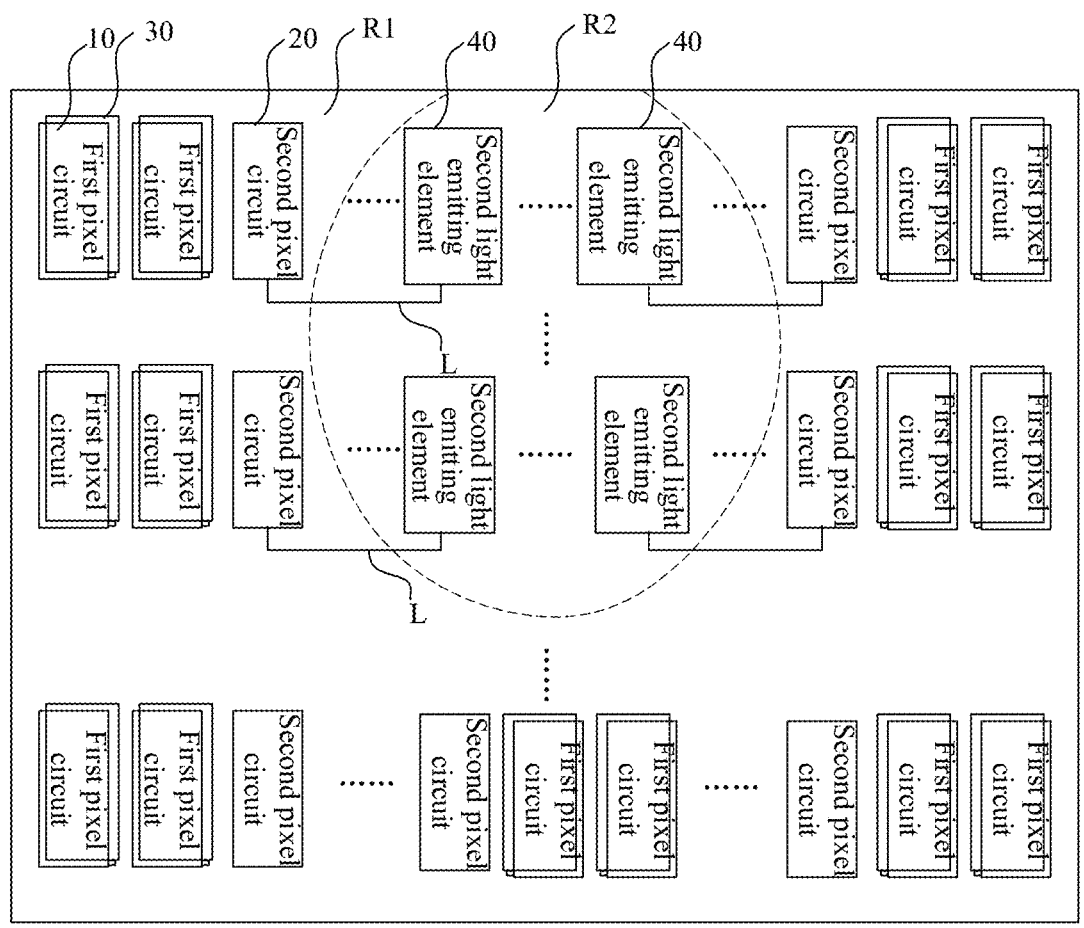
FIG. 2 is a schematic diagram of a partial structure of a display substrate according to at least one embodiment of the present disclosure.

FIG. 2 is a schematic diagram of a partial structure of a display substrate according to at least one embodiment of the present disclosure. In some exemplary embodiments, as shown in FIG. 2, the display substrate includes multiple first pixel circuits 10, multiple second pixel circuits 20, and multiple first light emitting elements 30 located in a first display region R1, and multiple second light emitting elements 40 located in a second display region R2. The multiple second pixel circuits 20 may be distributed among the multiple first pixel circuits 10 at intervals; for example, the multiple first pixel circuits 10 may be arranged between two adjacent second pixel circuits 20 in a first direction. At least one first pixel circuit 10 of the multiple first pixel circuits 10 may be connected with at least one first light emitting element 30 of the multiple first light emitting elements 30, and an orthographic projection of at least one first pixel circuit 10 on a base substrate may be at least partially overlapped with an orthographic projection of at least one first light emitting element 30 on the base substrate. A first pixel circuit 10 may be configured to provide a drive signal to a first light emitting element 30 with which the first pixel circuit 10 is connected to drive the first light emitting element 30 to emit light. At least one of the multiple second pixel circuits 20 may be connected with at least one of the multiple second light emitting elements 40 through a conductive line L. A second pixel circuit 20 may be configured to provide a drive signal to a second light emitting element 40 with which the second pixel circuit 20 is connected to drive the second light emitting element 40 to emit light. Since a second light emitting element 40 and a second pixel circuit 20 are located in different regions, there is no overlapping portion between an orthographic projection of at least one second pixel circuit 20 on the base substrate and an orthographic projection of at least one second light emitting element 40 on the base substrate.

In some exemplary embodiments, a density of second light emitting elements 40 of the second display region R2 may be approximately equal to a density of first light emitting elements 30 of the first display region R1. That is, a resolution of the second display region R2 may be approximately the same as that of the first display region R1. However, this embodiment is not limited thereto. For example, a density of the second light emitting elements 40 may be larger or smaller than that of the first light emitting elements 30. That is, the resolution of the second display region R2 may be larger or smaller than that of the first display region R1.

In some exemplary embodiments, a light emitting area of a second light emitting element 40 may be smaller than a light emitting area of a first light emitting element 30. That is, the light emitting area of the first light emitting element 30 is larger than that of the second light emitting element 40. A light emitting area of a light emitting element may correspond to an area of an opening of a pixel definition layer. In some examples, in the second display region R2, a light-transmissive region is provided between adjacent second light emitting elements 40. For example, multiple light-transmissive regions are connected with each other to form a continuous light-transmissive region separated by multiple second light emitting elements 40. The conductive line L may be made of a transparent conductive material to improve a light transmittance of the light-transmissive region as much as possible.

In some exemplary embodiments, in the first display region R1, a region where a second pixel circuit 20 is provided may be obtained by reducing a size of a first pixel circuit 10 in a second direction D2. For example, the size of the first pixel circuit 10 in the second direction D2 may be smaller than a size of a first light emitting element 30 in the second direction D2. The second direction D2 is, for example, a sub-pixel row direction, but it is not limited to this. In other embodiments, the second direction D2 may be a sub-pixel column direction. This exemplary embodiment will be described by taking the second direction D2 being the sub-pixel row direction as an example. For example, sizes of the first pixel circuit 10 and the second pixel circuit 20 in the second direction D2 may be the same, and a size of each pixel circuit in the second direction D2 may differ from the size of the first light emitting element 30 in the second direction D2 by about 4 microns (m). A size of each pixel circuit in a first direction D1 is approximately the same as that of the first light emitting element 30 in the first direction D1. The first direction D1 is perpendicular to the second direction D2.

In some exemplary embodiments, each of a first sub-display region R11, a second sub-display region, and a third sub-display region of the first display region R1 is provided with multiple first pixel circuits 10 and second pixel circuits 20. A second light emitting element 40 in the second display region R2 may be connected with a second pixel circuit 20 in the third sub-display region. A second pixel circuit 20 that is not connected with a light emitting element in the first display region R1 may be referred to as a dummy pixel circuit. However, this embodiment is not limited thereto. For example, the third sub-display region of the first display region R1 may be provided with first pixel circuits 10 and second pixel circuits 20 arranged between multiple first pixel circuits 10, and the first sub-display region R11 and the second sub-display region may be only provided with a first pixel circuit 10 and not provided with a second pixel circuit 20. Or, a third sub-display region and a second sub-display region of the first display region R1 may be provided with first pixel circuits 10 and second pixel circuits 20 arranged between multiple first pixel circuits 10, and the first sub-display region R11 may be only provided with a first pixel circuit 10 and not provided with a second pixel circuit 20.

Figure 3A:
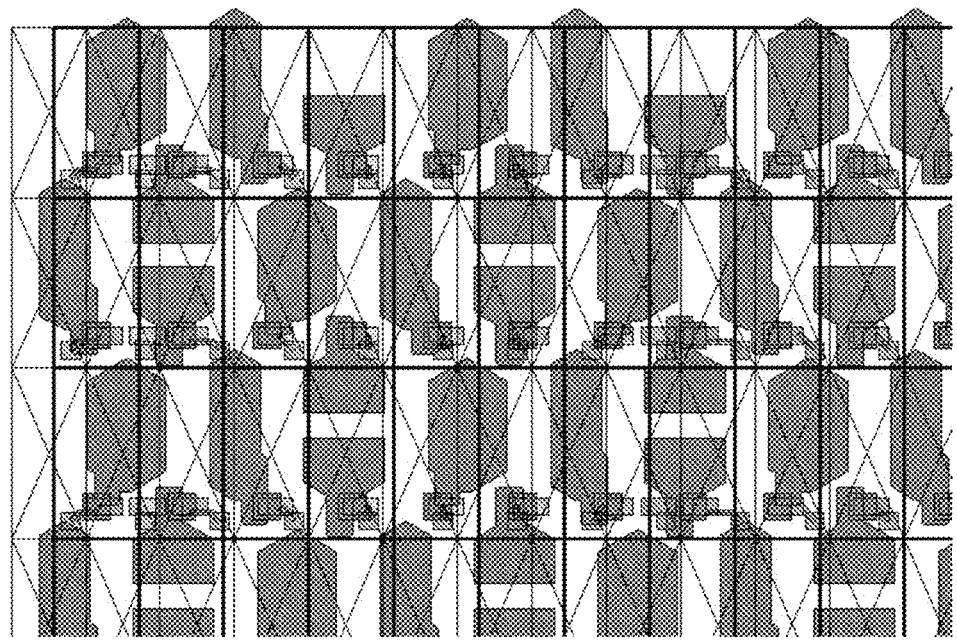
FIG. 3A to FIG. 3C are schematic diagrams of a partial structure of a first display region according to at least one embodiment of the present disclosure.
Figure 3B:
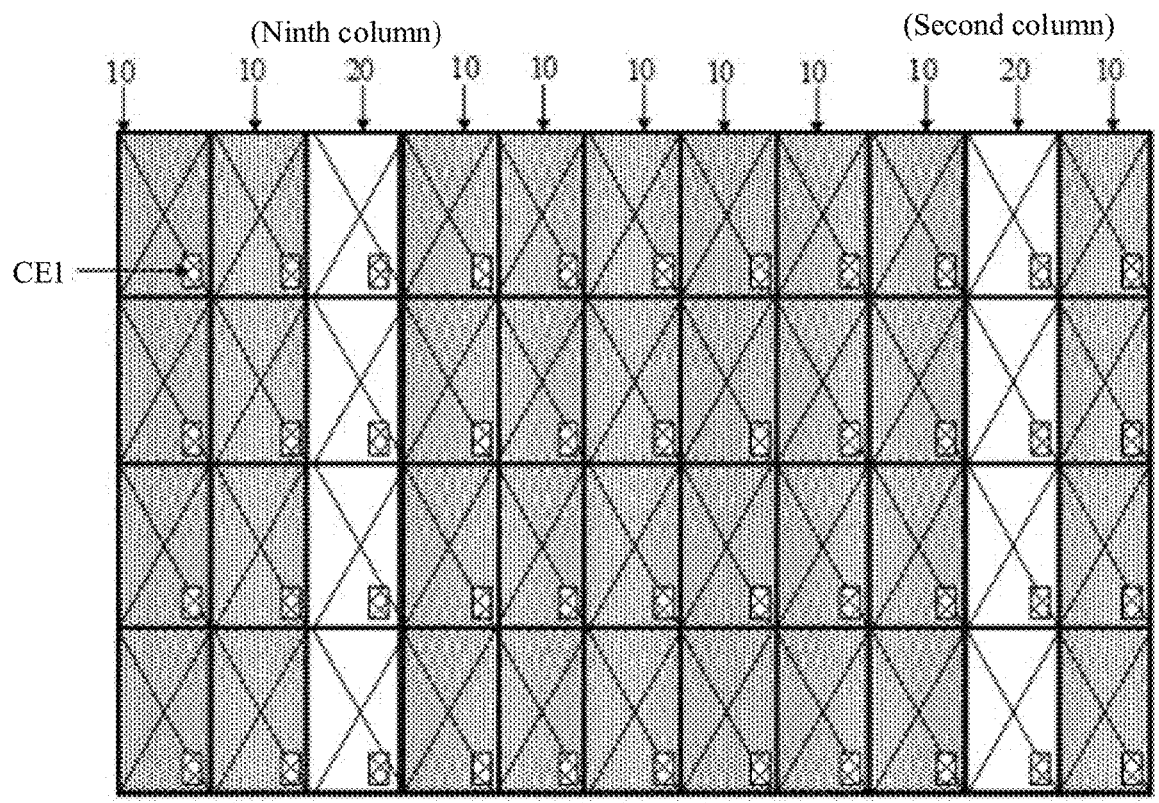
Figure 3C:
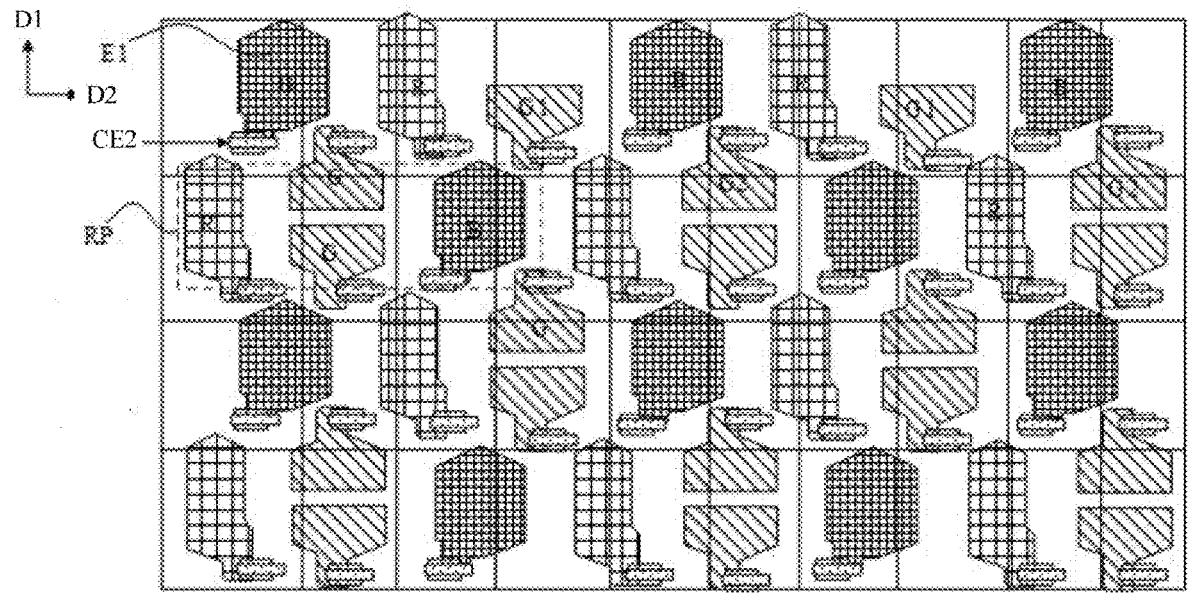

FIG. 3A to FIG. 3C are schematic diagrams of a partial structure of a first display region according to at least one embodiment of the present disclosure. In order to further show that there are extra multiple columns of pixel circuits after pixel circuits are compressed, FIG. 3A shows a schematic diagram of a structure of a sub-pixel of a first display region R1. FIG. 3B shows a schematic diagram of a partial structure (including only pixel circuits) of the first display region R1 in FIG. 3A, and FIG. 3C shows a schematic diagram of a partial structure (including only light emitting elements) of the first display region R1 in FIG. 3A.

In some exemplary embodiments, as shown in FIG. 3A to FIG. 3C, a size of a pixel circuit in a second direction D2 is smaller than that of a light emitting element in the second direction D2, in this way, pixel circuits in second and ninth columns from right to left are not connected with any first light emitting element 30, and belong to extra columns of pixel circuits, which may be used as second pixel circuits 20 to be connected with second light emitting elements 40 in a second display region R2, or only used as unused second pixel circuits 20 (i.e., dummy pixel circuits). As shown in FIG. 3C, any first light emitting element 30 may be one of four types of light emitting elements RG1BG2. A first electrode E1 of a first light emitting element 30 may be connected with a first transit electrode CE1 of a first pixel circuit 10 through a second transit electrode CE2. R represents a light emitting element that emits red light, G1 represents a light emitting element that emits green light, B represents a light emitting element that emits blue light, and G2 represents a light emitting element that emits green light. At least one second pixel circuit 20 may have a first transit electrode, and at least one second light emitting element 40 may have a second transit electrode. For example, the at least one second pixel circuit 20 and the at least one second light emitting element 40 are connected through the conductive line L, which may include: the conductive line L is respectively connected with a first transit electrode of at least one second pixel circuit 20 and a second transit electrode of at least one second light emitting element 40. In order to have enough space for disposing the conductive line L, axes of first and second transit electrodes in a same row of sub-pixels may be located on a straight line. However, this embodiment is not limited thereto.

In some exemplary embodiments, in a sub-pixel arrangement shown in FIG. 3C, one repeating unit RP includes two green (G) sub-pixels arranged in a first direction D1 and red (R) sub-pixels and blue (B) sub-pixels arranged respectively on both sides of the two green sub-pixels in the second direction D2. A red sub-pixel and a green sub-pixel may form a pixel unit, and a blue sub-pixel in another repeating unit adjacent to it may be used for forming a dummy pixel for display. A blue sub-pixel and a green sub-pixel may form a pixel unit, and a red sub-pixel in another repeating unit adjacent to it may be used for forming a dummy pixel for display. However, this embodiment is not limited thereto.

Figure 4:
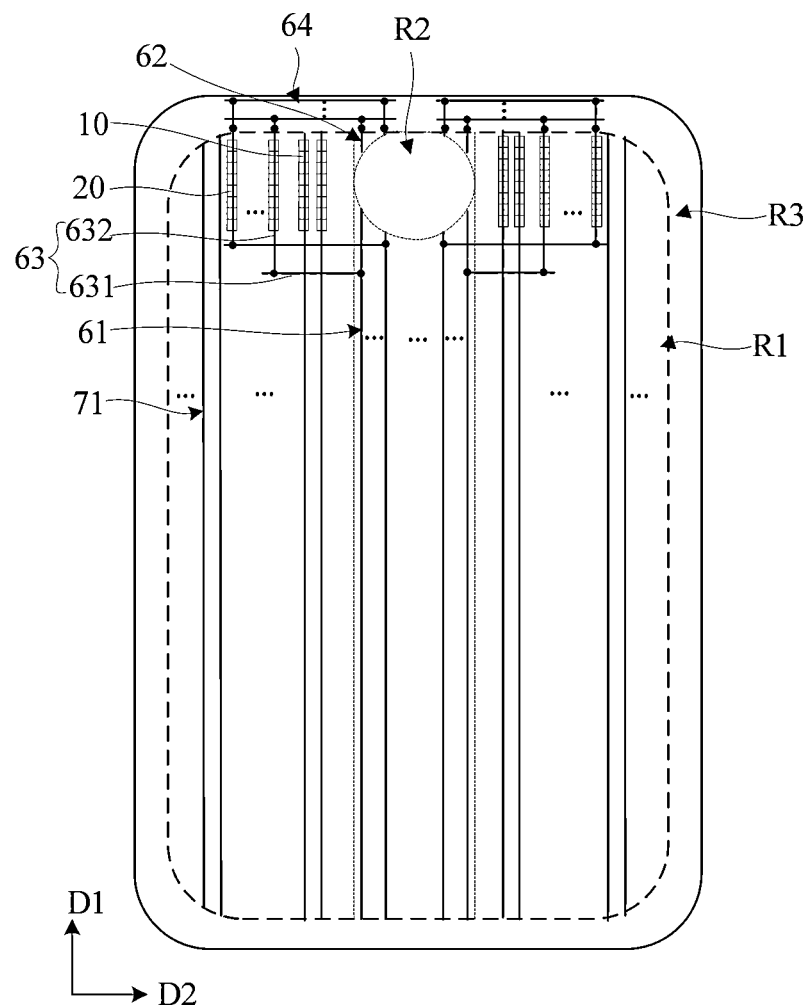
FIG. 4 is a schematic diagram of a layout of data lines of a display substrate according to at least one embodiment of the present disclosure.
Figure 5:
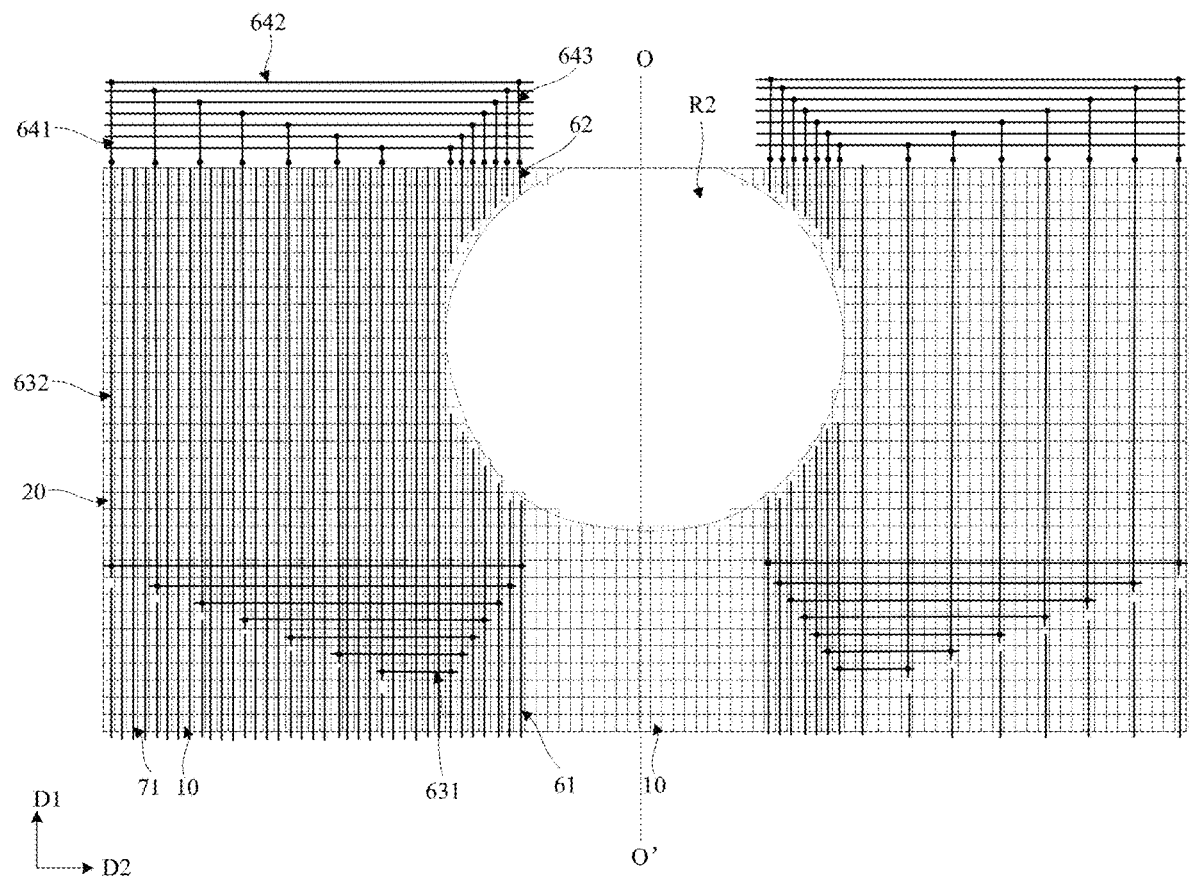
FIG. 5 is a schematic diagram of a partial layout of data lines of a display substrate according to at least one embodiment of the present disclosure.

FIG. 4 is a schematic diagram of a layout of data lines of a display substrate according to at least one embodiment of the present disclosure. FIG. 5 is a schematic diagram of a partial layout of data lines of a display substrate according to at least one embodiment of the present disclosure. Only several data lines are taken as an example for illustration in FIG. 4 and FIG. 5. Only several first pixel circuits 10 and second pixel circuits 20 are taken as an example for illustration in FIG. 4. In this example, the display substrate has a central axis OO' in a second direction D2 and the display substrate may be symmetrical about the central axis OO'. The following description will be given by taking an arrangement of data lines in a left half of the display substrate s an example.

In some exemplary embodiments, the bezel region R3 includes a drive chip region which may include an integrated circuit configured to be connected with multiple data lines of a display region. The second sub-display region may be located on a side of the second display region R2 away from the drive chip region, and the first sub-display region R11 may be located on a side of the second display region R2 close to the drive chip region.

In some exemplary embodiments, as shown in FIG. 1 and FIG. 4, the first display region R1 is provided with multiple first data lines. The bezel region R3 is provided with multiple data connection lines 64. At least one first data line is connected with at least one pixel circuit of the first sub-display region R11, and is connected with at least one pixel circuit of the second sub-display first sub-region R12a of the second sub-display region through at least one data connection line 64. For example, at least one first data line is connected with a column of first pixel circuits of the first sub-display region R11 and a column of first pixel circuits of the second sub-display first sub-region R12a.

In some exemplary embodiments, as shown in FIG. 1 and FIG. 4, at least one first data line includes a first sub-data line 61, a second sub-data line 62, and a third sub-data line 63. The third sub-data line 63 is connected between the first sub-data line 61 and the second sub-data line 62. The first sub-data line 61 is located in the first sub-display region R11 and is connected with a column of first pixel circuits of the first sub-display region R11. The second sub-data line 62 is located in the second sub-display first sub-region R12a of the second sub-display region and is connected with a column of first pixel circuits of the second sub-display first sub-region R12a. The third sub-data line 63 is located in the third sub-display first sub-region R13a of the third sub-display region, extends to the first sub-display region R11 and is connected with the first sub-data line 61, and is connected with the data connection line 64 of the bezel region R3. The third sub-data line 63 is connected with multiple second pixel circuits arranged along the first direction D1 in the third sub-display first sub-region R13a. The data connection line 64 of the bezel region R3 is connected with the second sub-data line 62 of the second sub-display first sub-region R12a. In this example, a data signal supplied from the drive chip region may be transmitted to the second sub-data line 62 through the first sub-data line 61, the third sub-data line 63, and the data connection line 64. The data signal is supplied to a pixel circuit of the second sub-display region after the third sub-data line 63 is wound in the third sub-display region, preventing a direct wiring of a data line in the second display region R2 from affecting a light transmittance of the second display region R2, thereby improving a display effect.

In some exemplary embodiments, the first display region R1 is provided with pixel circuits arranged in an array. For example, the third sub-display region is provided with n1 columns of pixel circuits, the first sub-display region R11 is provided with n2 columns of pixel circuits, and the second sub-display region is provided with n3 columns of pixel circuits. In this example, n3 may be less than n2. However, this embodiment is not limited thereto. For example, n3 may be equal to n2.

In some exemplary embodiments, as shown in FIG. 4 and FIG. 5, in the first sub-display region R11, the first sub-data line 61 extend along the first direction D1, and multiple first sub-data lines 61 are sequentially arranged along the second direction D2. A first sub-data line 61 may be connected with a column of first pixel circuits 10 and is configured to provide a data signal introduced from the drive chip region to a corresponding first pixel circuit 10. Or, a first sub-data line 61 may be connected with a column of second pixel circuits. In the second sub-display region, the second sub-data lines 62 may extend along the first direction D1, and multiple second sub-data lines 62 are sequentially arranged along the second direction D2. A second sub-data line 62 may be connected with a column of first pixel circuits 10 or a column of second pixel circuits 20 in the second sub-display region. The first sub-data line 61 and the second sub-data line 62 are separated by the second display region R2. In some examples, the first sub-data line 61 and the second sub-data line 62 may be of a same-layer structure.

In some exemplary embodiments, as shown in FIG. 4 and FIG. 5, in the third sub-display region, the third sub-data line 63 includes a first line segment 631 and a second line segment 632 connected with each other. The first line segment 631 extends along the second direction D2, and multiple first line segments 631 are arranged in sequence along the first direction D1. The second line segment 632 extends along the first direction D1, and multiple second line segments 632 are arranged in sequence along the second direction D2. One end of the first line segment 631 extends to the first sub-display region R11 and is connected with the first sub-data line 61, and the other end of the first line segment 631 is connected with the second line segment 632 in the third sub-display region. The second line segment 632 is connected with multiple second pixel circuits 20 arranged along the first direction D1 in the third sub-display region. In some examples, multiple second pixel circuits 20 with which the second line segment 632 is connected are connected with the second light emitting element 40 of the second display region R2. However, this embodiment is not limited thereto. For example, the multiple second pixel circuits 20 with which the second line segment 632 is connected may be dummy pixel circuits, i.e., may not be connected with a light emitting element. In some examples, the first line segment 631 and the second line segment 632 may be of a different-layer structure. For example, the second line segment 632 and the first sub-data line 61 may be of a same-layer structure, and the first line segment 631 and the first sub-data line 61 may be of a different-layer structure. In some examples, the first line segment 631 and the second line segment 632 may be of an integral structure, and have a different-layer structure with the first sub-data line 61. However, this embodiment is not limited thereto.

In some exemplary embodiments, as shown in FIG. 4 and FIG. 5, multiple data connection lines 64 are located on a side of the second display region R2 away from the drive chip region, for example, in an upper bezel region. At least one data connection line 64 includes a first sub-data connection line 641, a second sub-data connection line 642, and a third sub-data connection line 643. The first sub-data connection line 641 and the third sub-data connection line 643 extend along the first direction D1, and the second sub-data connection line 642 extends along the second direction D2. For example, lengths of multiple second sub-data connection lines 642 along the second direction D2 may be the same. Multiple first sub-data connection lines 641 and multiple third sub-data connection lines 643 are sequentially arranged along the second direction D2, and multiple second sub-data connection lines 642 are sequentially arranged along the first direction D1. The second sub-data connection line 642 is connected with the first sub-data connection line 641 and the third sub-data connection line 643 respectively. The first sub-data connection line 641 is connected with the second line segment 632 of the third sub-data line 63, and the third sub-data connection line 643 is connected with the second sub-data line 62. In some examples, the first sub-data connection line 641 and the third sub-data connection line 643 are of a same-layer structure and have a different-layer structure with the second sub-data connection line 642. The second sub-data connection line 642 may be of a same-layer structure as the second line segment 632 of the third sub-data line 63 and the second sub-data line 62. However, this embodiment is not limited thereto.

In some exemplary embodiments, a first light emitting element connected with a first pixel circuit connected with the first sub-data line 61 and a second light emitting element connected with a second pixel circuit connected with a corresponding third sub-data line 63 may be located in a same column. The first light emitting element connected with the first pixel circuit connected with the first sub-data line 61 and a first light emitting element connected with a first pixel circuit connected with a corresponding second sub-data line 62 may be located in a same column. However, this embodiment is not limited thereto.

In some exemplary embodiments, as shown in FIG. 4 and FIG. 5, first line segments 631 of multiple third sub-data lines 63 are arranged along the first direction D1, a first line segment 631 closer to the second display region R2 is connected with a first sub-data line 61 closer to the central axis OO'; and the first line segment 631 closer to the second display region R2 is connected with a second line segment 632 farther away from the central axis OO'. Along the second direction D2 away from the second display region R2, lengths of multiple second line segments 632 in the first direction D1 gradually decrease. Along the first direction D1 away from the second display region R2, lengths of multiple first line segments 631 in the second direction D2 gradually decrease. However, this embodiment is not limited thereto. For example, along the first direction D1 away from the second display region R2, the lengths of the multiple first line segments 631 in the second direction D2 are unchanged. For example, along the second direction D2 away from the second display region R2, the lengths of the multiple second line segments 632 in the first direction D1 gradually increase.

In some exemplary embodiments, the first display region R1 is further provided with multiple second data lines 71. The multiple second data lines 71 each extend along the first direction D1 and are sequentially arranged along the second direction D2. The second data lines 71 in the first display region R1 do not need to be wound. At least one second data line 71 may be connected with a column of pixel circuits (first pixel circuits or second pixel circuits). In the third sub-display region, for a column of second pixel circuits 20, a part of the second pixel circuits 20 is connected with a second line segment 632 of the third sub-data line 63, and the other part may be connected with a second data line 71, and the second line segment 632 of the third sub-data line 63 is disconnected from the second data line 71.

A pixel circuit of the present embodiment will be illustrated below with an example.

Figure 6A:
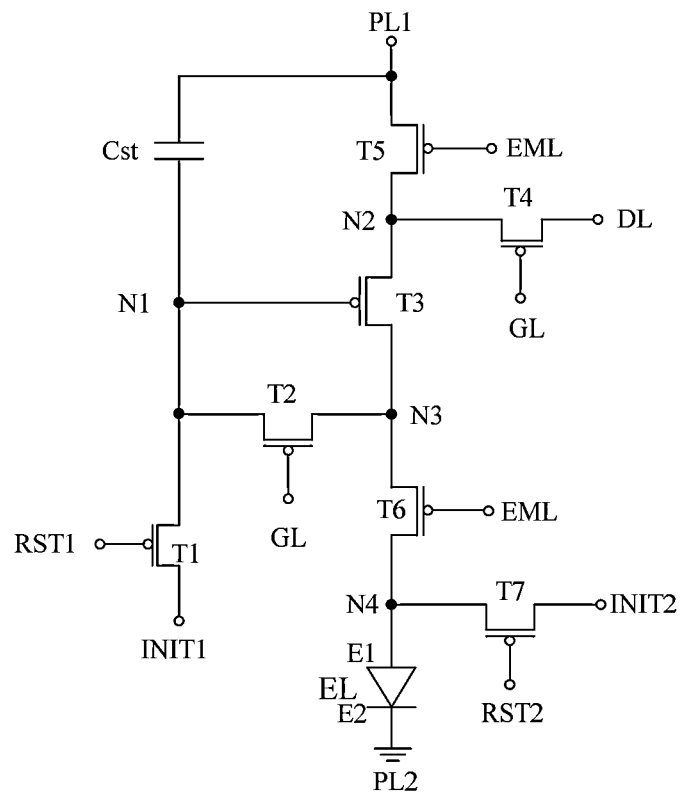
FIG. 6A is an equivalent circuit diagram of a pixel circuit according to at least one embodiment of the present disclosure.
Figure 6B:
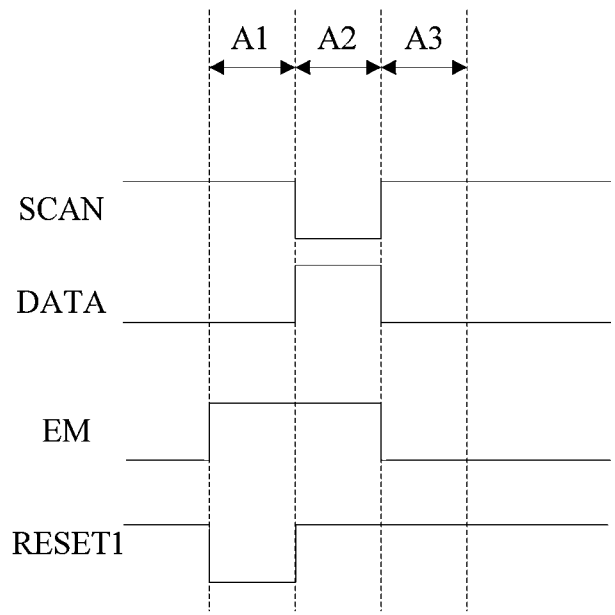
FIG. 6B is a working timing diagram of the pixel circuit shown in FIG. 6A.

FIG. 6A is an equivalent circuit diagram of a pixel circuit according to at least one embodiment of the present disclosure. FIG. 6B is a working timing diagram of the pixel circuit shown in FIG. 6A.

In some exemplary embodiments, each pixel circuit of the first display region R1 may be of a 7T1C structure. However, this embodiment is not limited thereto. For example, a pixel circuit may include other numbers of transistors and capacitors, for example, may be of a structure of 5T1C or 6T1C or the like.

In some exemplary embodiments, as shown in FIG. 6A, each pixel circuit includes six switching transistors (T1, T2, and T4 to T7), a drive transistor T3, and a storage capacitor Cst. The six switching transistors are respectively a data writing transistor T4, a threshold compensation transistor T2, a first emitting control transistor T5, a second emitting control transistor T6, a first reset transistor T1, and a second reset transistor T7. A light emitting element EL includes a first electrode E1, a second electrode E2, and an organic light emitting layer located between the first electrode E1 and the second electrode E2. For example, the first electrode E1 may be an anode and the second electrode E2 may be a cathode.

In some exemplary embodiments, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary embodiments, the drive transistor and the six switching transistors may include a P-type transistor and an N-type transistor.

In some exemplary embodiments, Low Temperature Poly-Silicon thin film transistors, or oxide thin film transistors, or a Low Temperature Poly-Silicon thin film transistor and an oxide thin film transistor may be adopted for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality.

In some exemplary embodiments, as shown in FIG. 6A and FIG. 6B, a display substrate includes a scan line GL, a data line DL, a first power supply line PL1, a second power supply line PL2, an emitting control line EML, a first initial signal line INIT1, a second initial signal line INIT2, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, and the first voltage signal VDD is greater than the second voltage signal VSS. The scan line GL is configured to provide a scan signal SCAN to a pixel circuit, the data line DL is configured to provide a data signal DATA to a pixel circuit, the emitting control line EML is configured to provide an emitting control signal EM to a pixel circuit, the first reset control line RST1 is configured to provide a first reset control signal RESET1 to a pixel circuit, and the second reset control line RST2 is configured to provide a scan signal SCAN to a pixel circuit. For example, in a row of pixel circuits, a second reset control line RST2 may be connected with a scan line GL to be input with a scan signal SCAN. However, this embodiment is not limited thereto. For example, a second reset control line RST2 may be input with a second reset control signal RESET2. For example, in a pixel circuit of an n-th row, a first reset control line RST1 may be connected with a scan line GL of a pixel circuit of an (n−1)-th row to be inputted with a scan signal SCAN(n−1), that is, a first reset control signal RESET1($n$) is the same as the scan signal SCAN(n−1). In this example, a first reset control line RST1 with which the pixel circuit of the n-th row is connected and the second reset control line RST2 with which the pixel circuit of the (n−1)-th row is connected may have an integral structure. Thus, signal lines of the display substrate may be reduced, and a narrow frame of the display substrate may be achieved.

In some examples, the first initial signal line INIT1 and the second initial signal line INIT2 may provide a same initial signal. For example, a first initial signal line INIT1 with which the pixel circuit of the n-th row is connected and a second initial signal line INIT2 with which the pixel circuit of the (n−1)-th row is connected may have an integral structure. However, this embodiment is not limited thereto.

In some exemplary embodiments, as shown in FIG. 6A, in the pixel circuit provided by the embodiment, a drive transistor T3 is electrically connected with a light emitting element EL, and outputs a drive current to drive the light emitting element EL to emit light under control of a scan signal SCAN, a data signal DATA, a first voltage signal VDD, a second voltage signal VSS and etc. A gate of a data writing transistor T4 is connected with a scan line GL, a first electrode of the data writing transistor T4 is connected with a data line DL, and a second electrode of the data writing transistor T4 is connected with a first electrode of the drive transistor T3. A gate of a threshold compensation transistor T2 is connected with the scan line GL, a first electrode of the threshold compensation transistor T2 is connected with a gate of the drive transistor T3, and a second electrode of the threshold compensation transistor T2 is connected with a second electrode of the drive transistor T3. A gate of a first emitting control transistor T5 is connected with an emitting control line EML, a first electrode of the first emitting control transistor T5 is connected with a first power supply line PL1, and a second electrode of the first emitting control transistor T5 is connected with the first electrode of the drive transistor T3. A gate of a second emitting control transistor T6 is connected with the emitting control line EML, a first electrode of the second emitting control transistor T6 is connected with the second electrode of the drive transistor T3, and a second electrode of the second emitting control transistor T6 is connected with a first electrode E1 of the light emitting element EL. A first reset transistor T1 is connected with the gate of the drive transistor T3 and configured to reset the gate of the drive transistor T3, and a second reset transistor T7 is connected with the first electrode E1 of the light emitting element EL and configured to reset the first electrode E1 of the light emitting element EL. A gate of the first reset transistor T1 is connected with the first reset control line RST1, a first electrode of the first reset transistor T1 is connected with a first initial signal line INIT1, and a second electrode of the first reset transistor T1 is connected with the gate of the drive transistor T3. A gate of the second reset transistor T7 is connected with a second reset control line RST2, a first electrode of the second reset transistor T7 is connected with a second initial signal line INIT2, and a second electrode of the second reset transistor T7 is connected with the first electrode E1 of the light emitting element EL. A first electrode of a storage capacitor Cst is connected with the gate of the drive transistor T3, and a second electrode of the storage capacitor Cst is connected with the first power supply line PL1. In this example, a first node N1 is a connection point of the storage capacitor Cst, the first reset transistor T1, the drive transistor T3, and the threshold compensation transistor T2, a second node N2 is a connection point of the first emitting control transistor T5, the data writing transistor T4, and the drive transistor T3, a third node N3 is a connection point of the drive transistor T3, the threshold compensation transistor T2, and the second emitting control transistor T6, and a fourth node N4 is a connection point of the second emitting control transistor T6, the second reset transistor T7, and the light emitting element EL.

A working process of the pixel circuit illustrated in FIG. 6A will be described below with reference to FIG. 6B. Description will be given by taking as an example that multiple transistors included in the pixel circuit are all P-type transistors.

In some exemplary embodiments, as shown in FIG. 6B, during one frame display period, a working process of a pixel circuit of a first structure includes a first stage A1, a second stage A2, and a third stage A3.

The first stage A1 is referred to as a reset stage. A first reset control signal RESET1 provided by the first reset control line RST1 is a low-level signal, so that the first reset transistor T1 is turned on, and an initial signal Vinit provided by the first initial signal line INIT1 is provided to the first node N1 to initialize the first node N1 and clear an original data voltage in the storage capacitor Cst. A scan signal SCAN provided by the scan line GL is a high-level signal, and an emitting control signal EM provided by the emitting control line EML is a high-level signal, so that the data writing transistor T4, the threshold compensation transistor T2, the first emitting control transistor T5, the second emitting control transistor T6, and the second reset transistor T7 are turned off. In this stage, the light emitting element EL does not emit light.

The second stage A2 is referred to as a data writing stage or a threshold compensation stage. A scan signal SCAN provided by the scan line GL is a low-level signal, a first reset control signal RESET1 provided by the first reset control line RST1 and an emitting control signal EM provided by the emitting control line EML are both high-level signals, and the data line DL outputs a data signal DATA. In this stage, the second electrode of the storage capacitor Cst is at a low level, so that the drive transistor T3 is turned on. The scan signal SCAN is a low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the second electrode (that is, the first node N1) of the storage capacitor Cst is Vdata−|Vth|, wherein Vdata is the data voltage output by the data line DL, and Vth is the threshold voltage of the drive transistor T3. The second reset transistor T7 is turned on, so that an initial signal Vinit provided by the second initial signal line INIT2 is provided to the first electrode E1 of the light emitting element EL to initialize (reset) the first electrode E1 of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The emitting control signal EM provided by the emitting control signal line EML is a high-level signal, so that the first emitting control transistor T5 and the second emitting control transistor T6 are turned off.

The third stage A3 is referred to as a light emitting stage. An emitting control signal EM provided by the emitting control signal line EML is a low-level signal, and a scan signal SCAN provided by the scan line GL and a first reset control signal RESET1 provided by the first reset control line RST1 are high-level signals. The emitting control signal EM provided by the emitting control signal line EML is a low-level signal, so that the first emitting control transistor T5 and the second emitting control transistor T6 are turned on, and a first voltage signal VDD output by the first power supply line PL1 provides a drive voltage to the first electrode E1 of the light emitting element EL through the turned-on first emitting control transistor T5, the drive transistor T3, and the second emitting control transistor T6 to drive the light emitting element EL to emit light.

In a drive process of the pixel circuit, a drive current flowing through the drive transistor T3 is determined by a voltage difference between the gate and the first electrode of the drive transistor T3. Since the voltage of the first node N1 is Vdata−|Vth|, the drive current of the drive transistor T3 is as follows.

$$I = K*(Vgs - Vth)^2 = K*[(VDD - Vdata + |Vth|) - Vth]^2 = K*[(VDD - Vdata)]^2$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL is independent of the threshold voltage of the drive transistor T3. Therefore, the pixel circuit of this embodiment may better compensate the threshold voltage of the drive transistor T3.

Figure 7A:
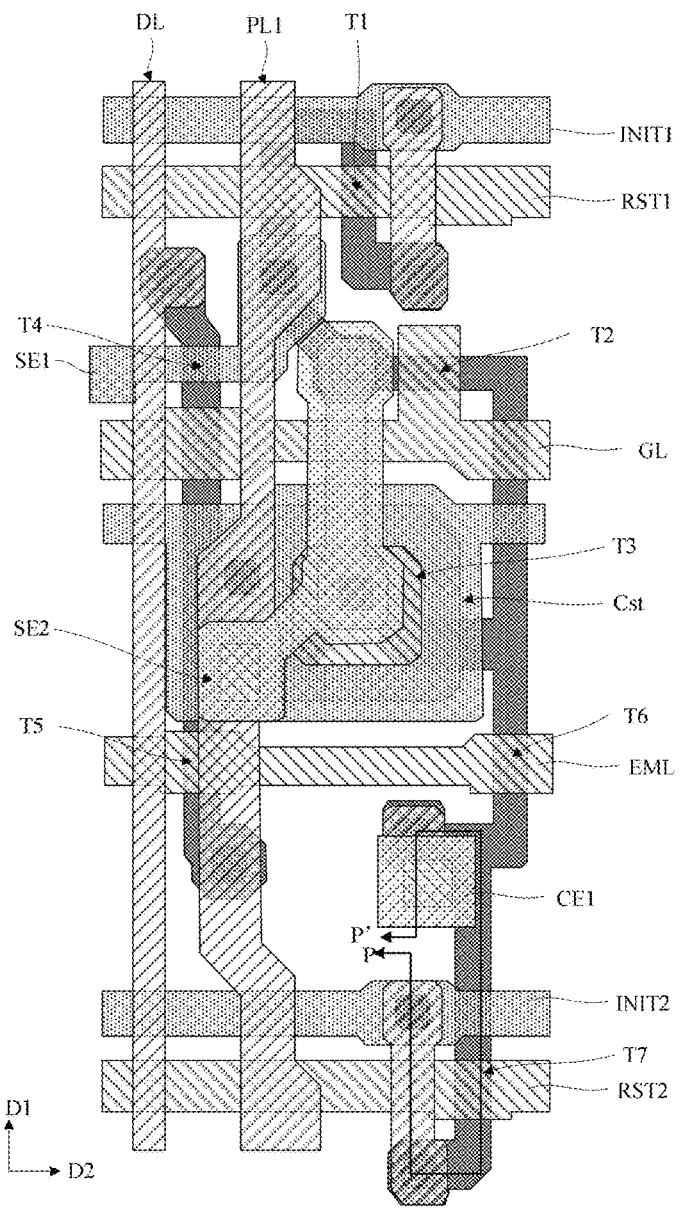
FIG. 7A is a schematic plan view of a pixel circuit according to at least one embodiment of the present disclosure.
Figure 7B:
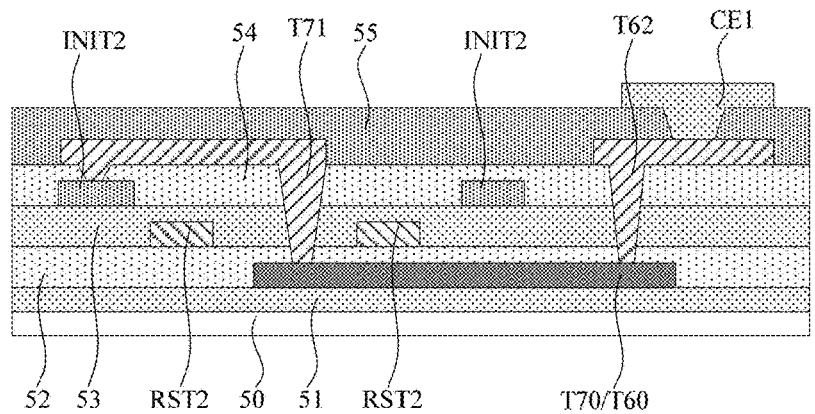
FIG. 7B is a partial sectional schematic diagram along a P-P' direction in FIG. 7A.

FIG. 7A is a schematic plan view of a pixel circuit according to at least one embodiment of the present disclosure. FIG. 7B is a partial sectional schematic diagram along a P-P' direction in FIG. 7A. A first direction D1 may be a direction of sub-pixel columns (a vertical direction), and a second direction D2 may be a direction of sub-pixel rows (a horizontal direction).

In some exemplary embodiments, in a plane parallel to a display substrate, the display substrate is provided with a scan line GL, an emitting control line EML, a first reset control line RST1, a first initial signal line INIT1, a second initial signal line INIT2, a first power supply line PL1, a data line DL, and a pixel circuit. The pixel circuit may include multiple transistors and a storage capacitor Cst, and the multiple transistors may include a drive transistor T3, a data writing transistor T4, a threshold compensation transistor T2, a first reset transistor T1, a second reset transistor T7, a first emitting control transistor T5, and a second emitting control transistor T6.

In some exemplary embodiments, in a plane perpendicular to the display substrate, the display substrate may include a semiconductor layer, a first conductive layer, a second conductive layer, and a third conductive layer, and a fourth conductive layer that are sequentially disposed on a base substrate 50. In some examples, the semiconductor layer may include active layers of multiple transistors. The first conductive layer may include a scan line GL, a first reset control line RST1, a second reset control line RST2, an emitting control line EML, a first electrode of a storage capacitor Cst, and gates of multiple transistors. The second conductive layer may include a first initial signal line INIT1, a second initial signal line INIT2, a second electrode of the storage capacitor Cst, and a first shield electrode SE1. The third conductive layer may include a first power supply line PL1, a data line DL, and first and second electrodes of multiple transistors. The fourth conductive layer may include a second shield electrode SE2 and a first connection electrode CE1.

In some exemplary embodiments, as shown in FIG. 7B, a display substrate may include a first insulation layer 51, a second insulation layer 52, a third insulation layer 53, a fourth insulation layer 54, and a fifth insulation layer 55. The first insulation layer 51 is disposed between the base substrate 50 and the semiconductor layer, the second insulation layer 52 is disposed between the semiconductor layer and the first conductive layer, the third insulation layer 53 is disposed between the first conductive layer and the second conductive layer, the fourth insulation layer 54 is disposed between the second conductive layer and the third conductive layer, and the fifth insulation layer 55 is disposed between the third conductive layer and the fourth conductive layer. In some examples, the first insulation layer 51, the second insulation layer 52, the third insulation layer 53, and the fourth insulation layer 54 may be inorganic insulation layers, and the fifth insulation layer 55 may be an organic insulation layer. However, this embodiment is not limited thereto.

Figure 7C:
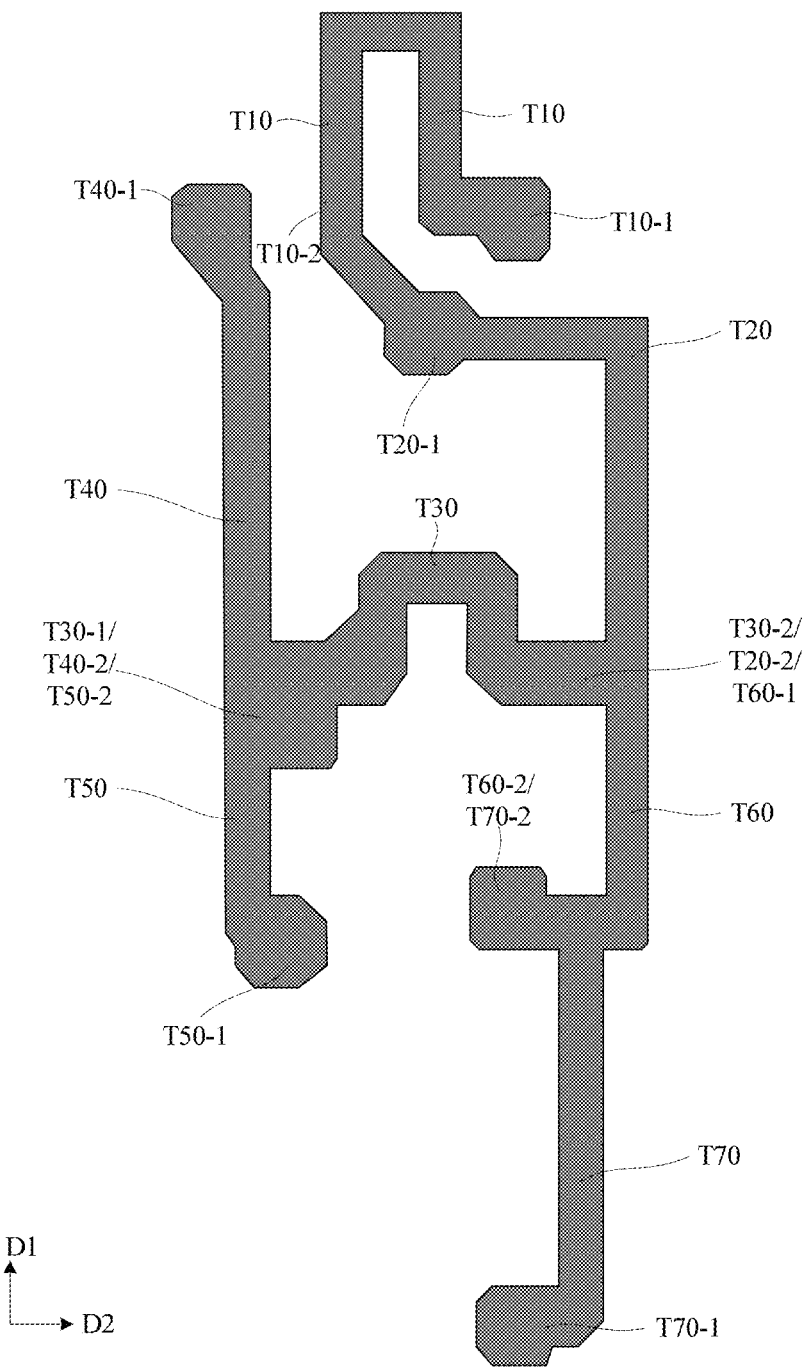
FIG. 7C is a schematic diagram of a pixel circuit after a semiconductor layer is formed according to at least one embodiment of the present disclosure.

FIG. 7C is a schematic diagram of a pixel circuit after a semiconductor layer is formed according to at least one embodiment of the present disclosure. In some exemplary embodiments, as shown in FIG. 7C, a semiconductor layer of at least one sub-pixel may include a first active layer T10 of a first reset transistor T1, a second active layer T20 of a threshold compensation transistor T2, a third active layer T30 of a drive transistor T3, a fourth active layer T40 of a data writing transistor T4, a fifth active layer T50 of a first emitting control transistor T5, a sixth active layer T60 of a second emitting control transistor T6, and a seventh active layer T7 of a second reset transistor T7. Among them, the first active layer T10 to the seventh active layer T70 are connected with each other to be of an integral structure.

In some exemplary embodiments, as shown in FIG. 7C, the first active layer T10 may be in a shape of "n", the second active layer T20 may be in a shape of "7", the third active layer T30 may be in a shape of " ⌐⌐ ", the fourth active layer T40 may be in a shape of "1", the fifth active layer T50, the sixth active layer T60, and the seven active layers T70 may be in a shape of "L".

In some exemplary embodiments, an active layer of each transistor may include a first region, a second region, and a channel region located between the first region and the second region. In some examples, as shown in FIG. 7C, a second region T10-2 of the first active layer T10 is simultaneously used as a first region T20-1 of the second active layer T20; a first region T30-1 of the third active layer T30 is simultaneously used as a second region T40-2 of the fourth active layer T40 and a second region T50-2 of the fifth active layer T50, a second region T30-2 of the third active layer T30 is simultaneously used as a second region T20-2 of the second active layer T20 and a first region T60-1 of the sixth active layer T60, and a second region T60-2 of the sixth active layer T60 is simultaneously used as a second region T70-2 of the seventh active layer T70.

Figure 7D:
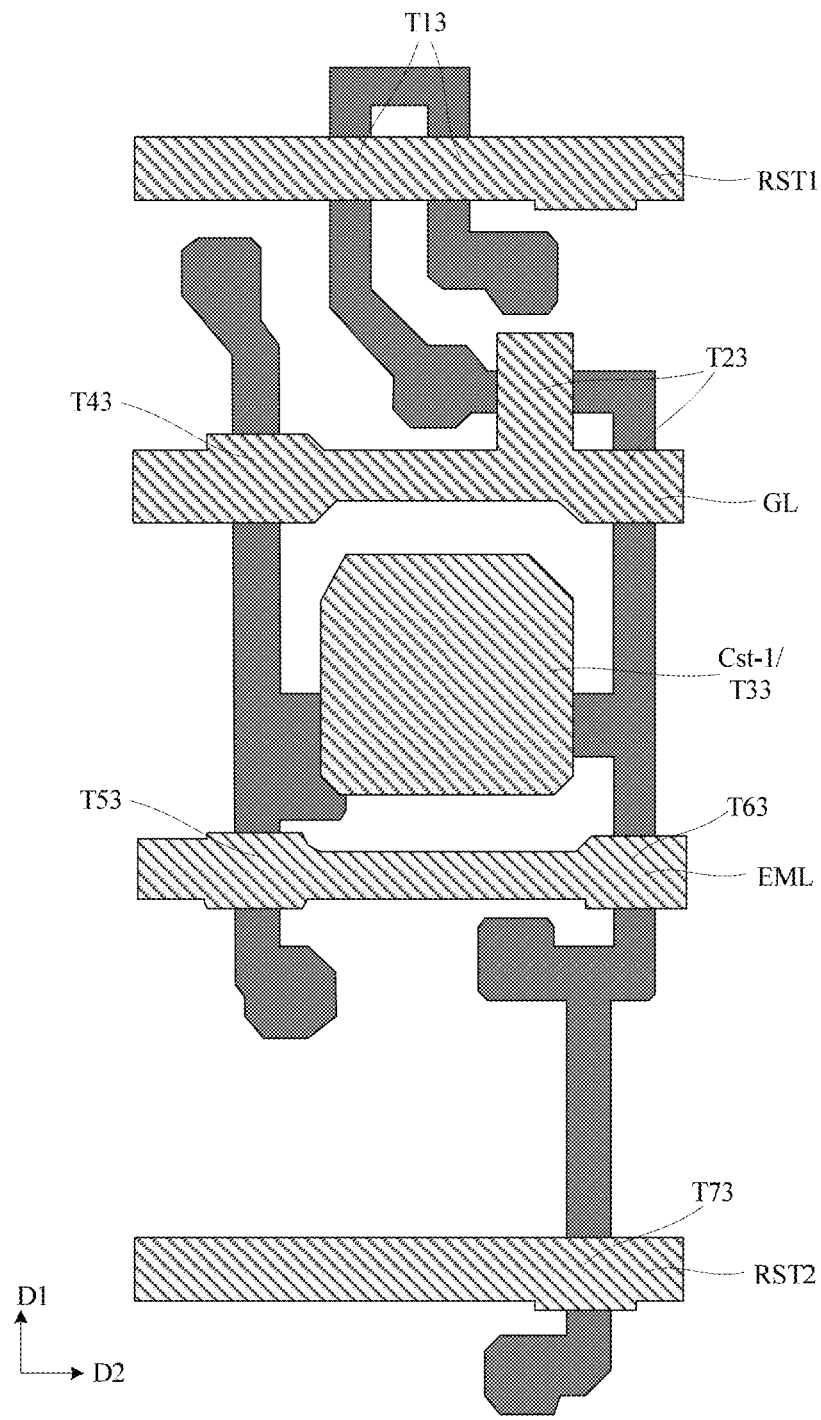
FIG. 7D is a schematic diagram of a pixel circuit after a first conductive layer is formed according to at least one embodiment of the present disclosure.

FIG. 7D is a schematic diagram of a pixel circuit after a first conductive layer is formed according to at least one embodiment of the present disclosure. In some exemplary embodiments, as shown in FIG. 7D, the first conductive layer at least includes a first electrode Cst-1 of a storage capacitor Cst, a scan line GL extending along a second direction D2, an emitting control line EML, a first reset control line RST1, and a second reset control line RST2. The first electrode Cst-1 of the storage capacitor Cst may be in a shape of a rectangle, and corners of the rectangle may be chamfered. There is an overlapping region between an orthographic projection of the first electrode Cst-1 on a base substrate and an orthographic projection of the third active layer T30 of a drive transistor T3 on the base substrate. The first electrode Cst-1 of the storage capacitor CST simultaneously serves as a gate T33 of the drive transistor T3. The scan line GL, a gate T43 of a data writing transistor T4, and a gate T23 of a threshold compensation transistor T2 may be of an integral structure. The emitting control line EML, a gate T53 of a first emitting control transistor T5, and a gate T63 of a second emitting control transistor T6 may be of an integral structure. The first reset control line RST1 and a gate T13 of a first reset transistor T1 may be of an integral structure. The second reset control line RST12 and a gate T73 of a second reset transistor T7 may be of an integral structure.

Figure 7E:
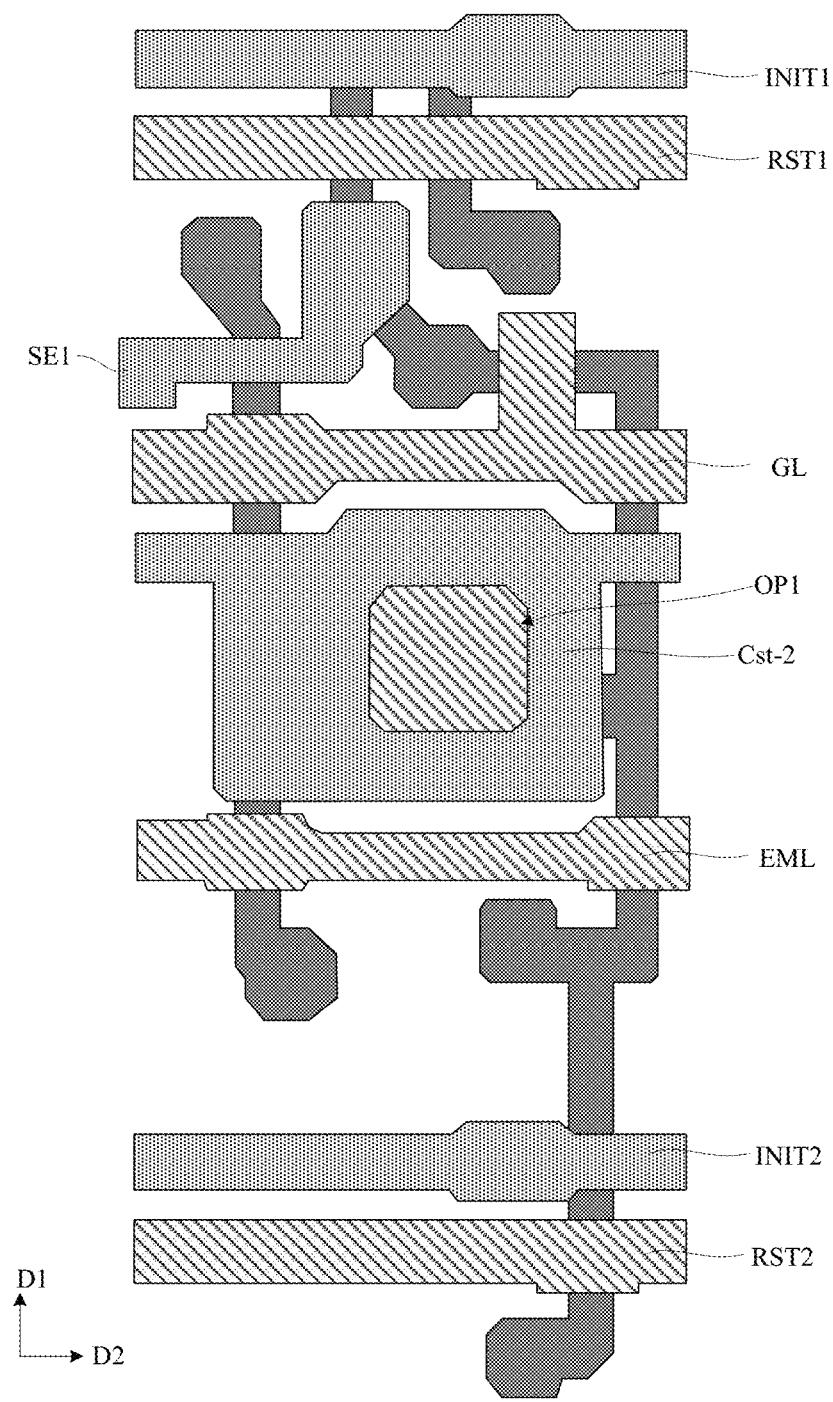
FIG. 7E is a schematic diagram of a pixel circuit after a second conductive layer is formed according to at least one embodiment of the present disclosure.

FIG. 7E is a schematic diagram of a pixel circuit after a second conductive layer is formed according to at least one embodiment of the present disclosure. In some exemplary embodiments, as shown in FIG. 7E, the second conductive layer at least includes a first initial signal line INIT1, a second initial signal line INIT2, a second electrode Cst-2 of a storage capacitor Cst, and a first shield electrode SE1. The first initial signal line INIT1 and the second initial signal line INIT2 both extend along a second direction D2 and are located on opposite sides of the second electrode Cst-2 of the storage capacitor Cst in a first direction D1. An orthographic projection of the second electrode Cst-2 of the storage capacitor Cst on a base substrate is located between an orthographic projection of a scan line GL and an orthographic projection of an emitting control line EML on the base substrate. There is an overlapping region between the orthographic projection of the second electrode Cst-2 of the storage capacitor Cst on the base substrate and an orthographic projection of a first electrode Cst-1 on the base substrate. The second electrode Cst-2 is provided with an opening OP1, which exposes a third insulation layer 53 covering the first electrode Cst-1, and an orthographic projection of the first electrode Cst-1 on the base substrate includes an orthographic projection of the opening OP1 on the base substrate. In some examples, the opening OP1 is configured to accommodate a first via H1 subsequently formed, the first via H1 is located in the opening OP1 and exposes the first electrode Cst-1, so that a second electrode of a first transistor T1 subsequently formed is connected with the first electrode Cst-1.

In some exemplary embodiments, as shown in FIG. 7E, the first shield electrode SE1 is located on a side of the scan line GL away from the storage capacitor Cst. The first shield electrode SE1 is configured to shield an influence of a data voltage jump on a key node, so as to avoid an influence of the data voltage jump on a potential of the key node of a pixel circuit, and improve a display effect.

Figure 7F:
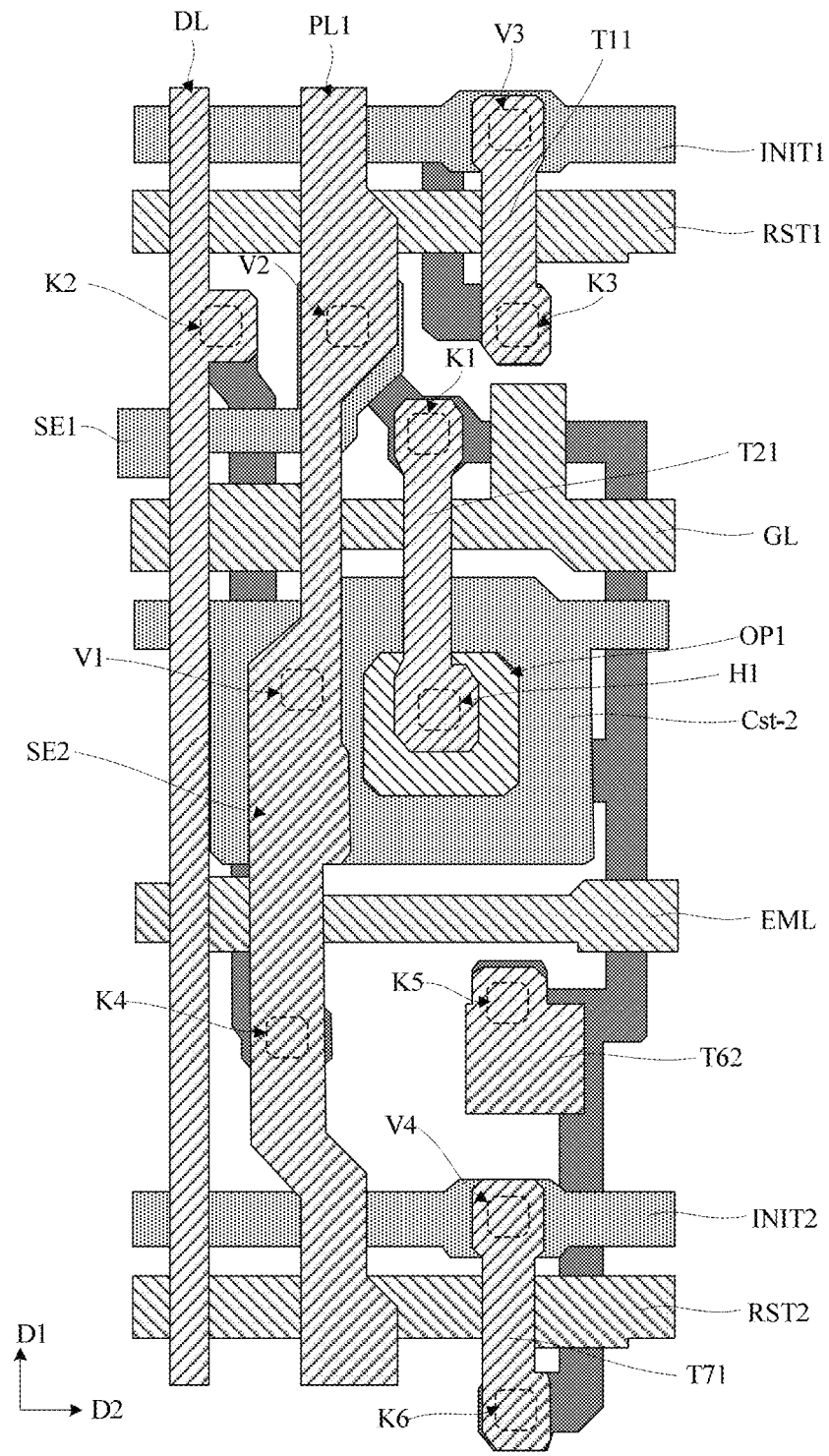
FIG. 7F is a schematic diagram of a pixel circuit after a third conductive layer is formed according to at least one embodiment of the present disclosure.

FIG. 7F is a schematic diagram of a pixel circuit after a third conductive layer is formed according to at least one embodiment of the present disclosure. In some exemplary embodiments, as shown in FIG. 7F, a first via H1, multiple second vias V1 to V4, and multiple third vias K1 to K6 are formed on a fourth insulation layer. The fourth insulation layer 54 and a third insulation layer 53 in the first via H1 are etched away to expose a surface of a first conductive layer. The fourth insulation layer 54 in the multiple second vias V1 to V4 is etched away to expose a surface of a second conductive layer. The fourth insulation layer 54, the third insulation layer 53, and a second insulation layer 52 in the multiple third vias K1 to K6 are etched away to expose a surface of a semiconductor layer.

In some exemplary embodiments, as shown in FIG. 7F, the third conductive layer may include a data line DL, a first power supply line PL1, a first electrode T11 of a first reset transistor T1, a first electrode T71 of a second reset transistor T7, a first electrode T21 of a threshold compensation transistor T2, and a second electrode T62 of a second emitting control transistor T6. The data line DL and the first power supply line PL1 extend along a first direction D1.

In some exemplary embodiments, as shown in FIG. 7F, the data line DL is connected with a first region T40-1 of a fourth active layer T40 of a data writing transistor T4 through a third via K2. The first power supply line PL1 is connected with a second electrode Cst-2 of a storage capacitor Cst through a second via V1, is connected with a first shield electrode SE1 through a second via V2, and is connected with a first region T50-1 of a fifth active layer T50 of a first emitting control transistor T5 through a third via K4. The first electrode T21 of the threshold compensation transistor T2 is connected with the first electrode Cst-1 of the storage capacitor Cst through a first via H1, and is connected with a first region T20-1 of a second active layer T20 of the threshold compensation transistor T2 through a third via K1. The second electrode T62 of the second emitting control transistor T6 is connected with a second region T60-2 of a sixth active layer T60 of the second emitting control transistor T6 through a third via K5. The first electrode T11 of the first reset transistor T1 is connected with a first initial signal line INIT1 through a second via V3, and is connected with a first region T10-1 of a first active layer T10 of the first reset transistor T1 through a third via K3. The first electrode T71 of the second reset transistor T7 is connected with a first region T70-1 of a seventh active layer t70 of the second reset transistor T7 through a third via K6. The first electrode T71 of the second reset transistor T7 is also connected with a second initial signal line INIT2 through a second via V4.

Figure 7G:
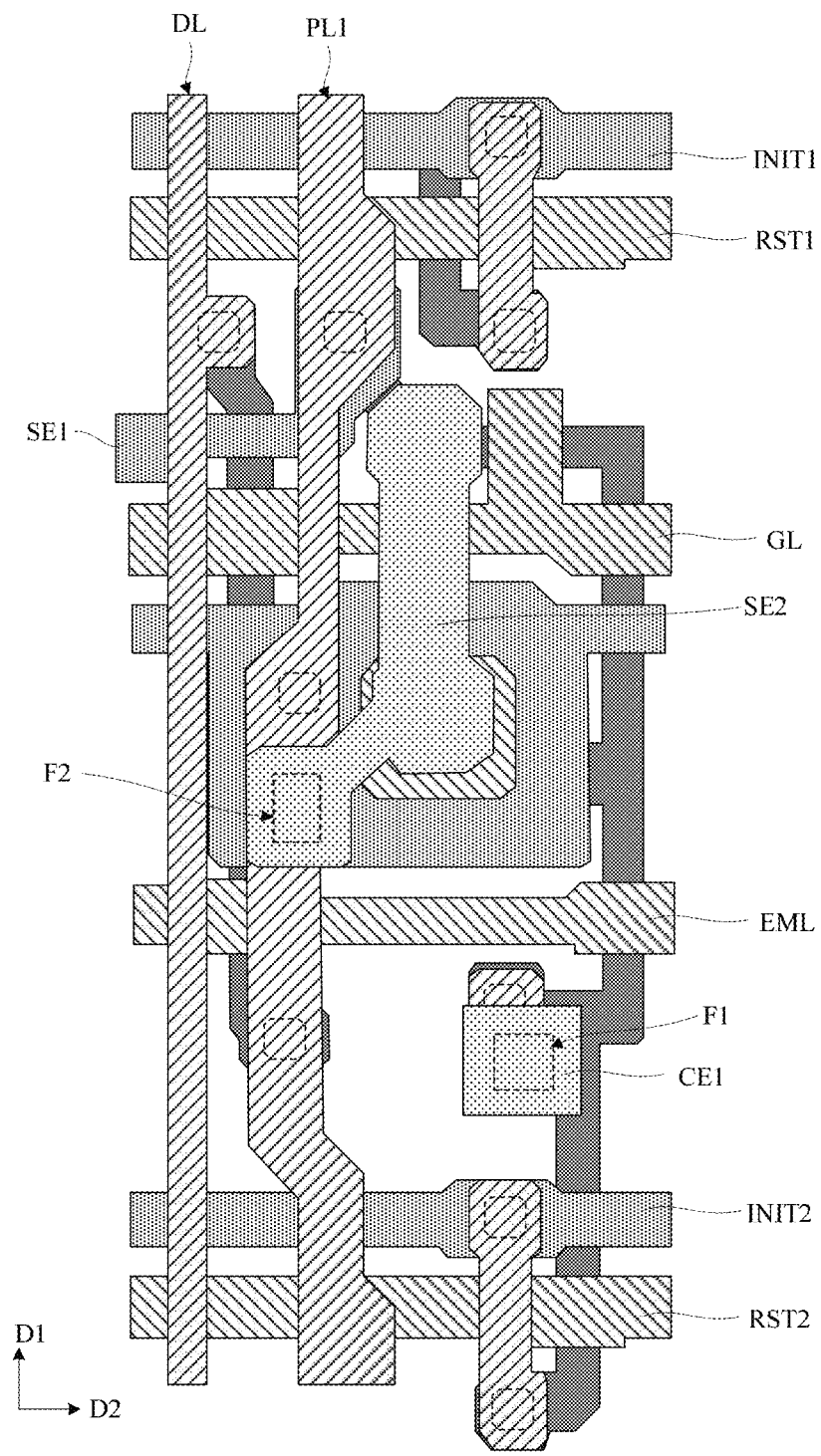
FIG. 7G is a schematic diagram of a pixel circuit after a fourth conductive layer is formed according to at least one embodiment of the present disclosure.

FIG. 7G is a schematic diagram of a pixel circuit after a fourth conductive layer is formed according to at least one embodiment of the present disclosure. In some exemplary embodiments, multiple fourth vias F1 to F2 are formed on a fifth insulation layer 55. The fifth insulation layer 55 in the multiple fourth vias F1 to F2 is etched away to expose a surface of a third conductive layer.

In some exemplary embodiments, the fourth conductive layer at least includes a second shield electrode SE2 and a first transit electrode CE1. The first transit electrode CE1 is connected with a second electrode T62 of a second emitting control transistor T6 through a fourth via F1. The first transit electrode CE1 may be directly connected with a first-region light emitting element, or connected with a second transit electrode of a first-region light emitting element, or connected with a second transit electrode of a second-region light emitting element through a conductive line. The second shield electrode SE2 is connected with a first power supply line PL1 through a fourth via F2. An orthographic projection of the second shield electrode SE2 on a base substrate is partially overlapped with an orthographic projection of a drive transistor T3 on the base substrate. The second shield electrode SE2 is configured to shield an influence of a conductive line on the drive transistor T3, so as to improve a display effect.

Figure 8A:
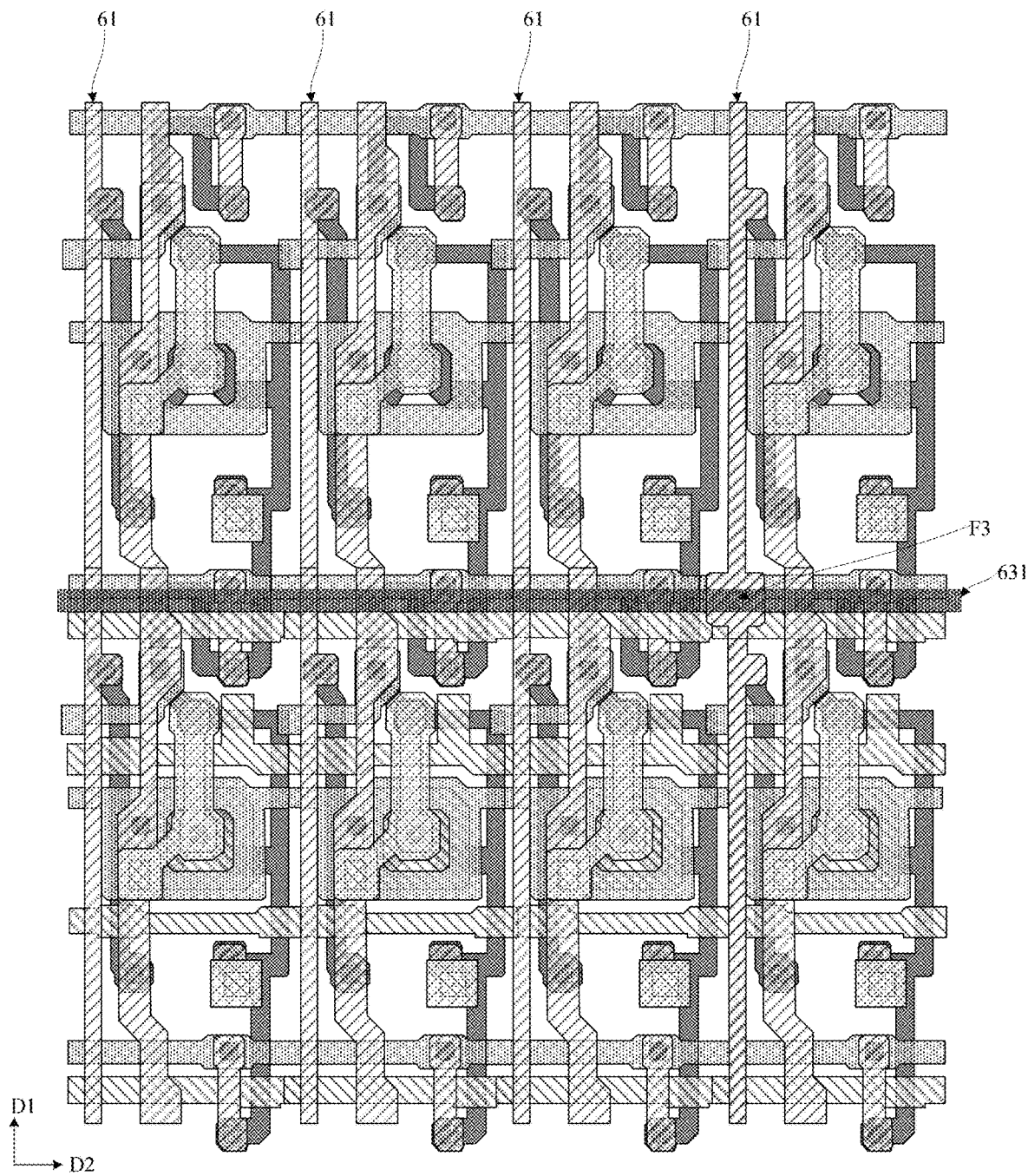
FIG. 8A is a schematic diagram of a connection position of a first sub-data line and a third sub-data line according to at least one embodiment of the present disclosure.
Figure 8B:
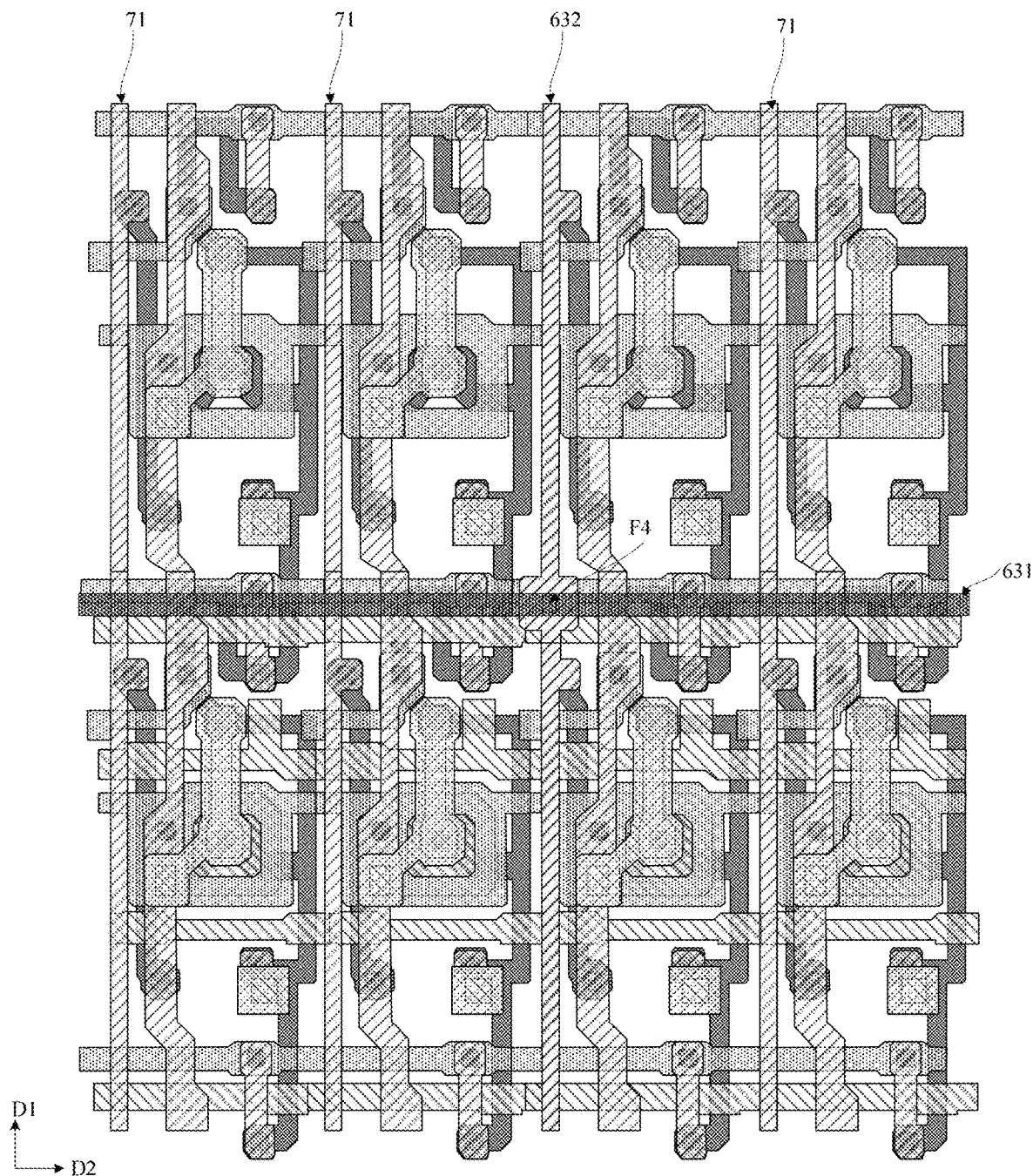
FIG. 8B is a schematic diagram of a connection position of a first line segment and a second line segment of a third sub-data line according to at least one embodiment of the present disclosure.

FIG. 8A is a schematic diagram of a connection position of a first sub-data line and a first line segment of a third sub-data line according to at least one embodiment of the present disclosure. FIG. 8B is a schematic diagram of a connection position of a first line segment and a second line segment of a third sub-data line according to at least one embodiment of the present disclosure.

In some exemplary embodiments, as shown in FIG. 8A, in a first sub-display region R11, a first sub-data line 61 is a data line DL connecting a column of pixel circuits (e.g., first pixel circuits). A fourth via F3 is formed on a fifth insulation layer 55. A first line segment 631 of a third sub-data line 63 is located on a fourth conductive layer. The first line segment 631 of the third sub-data line 63 is connected with the first sub-data line 61 through the fourth via F3 formed on the fifth insulation layer 55.

In some exemplary embodiments, as shown in FIG. 8B, in a third sub-display region (e.g. a third sub-display first sub-region R13a), a second line segment 632 of the third sub-data line 63 is a data line DL connecting multiple second pixel circuits arranged along a first direction D1, and a second data line 71 is a data line DL connecting a column of first pixel circuits. The second line segment 632 of the third sub-data line 63 is located in a third conductive layer, and the first line segment 631 is located in a fourth conductive layer. The first line segment 631 is connected with the second line segment 632 through a fourth via F4 formed on the fifth insulation layer 55. A length of the first line segment 631 along a second direction D2 is greater than a distance between the fourth via F3 and the fourth via F4 to ensure an effective connection of the first line segment 631 with the second line segment 632 and the first sub-data line 61.

In some exemplary embodiments, as shown in FIG. 8A and FIG. 8B, an orthographic projection of the first line segment 631 on a base substrate 50 may be overlapped with orthographic projections of a first initial signal line INIT1 and a second reset control line RST2 on the base substrate 50, and the orthographic projection of the first line segment 631 on the base substrate 50 may be located between the orthographic projections of the first initial signal line INIT1 and the second reset control line RST2 on the base substrate 50. However, this embodiment is not limited thereto.

Figure 8C:
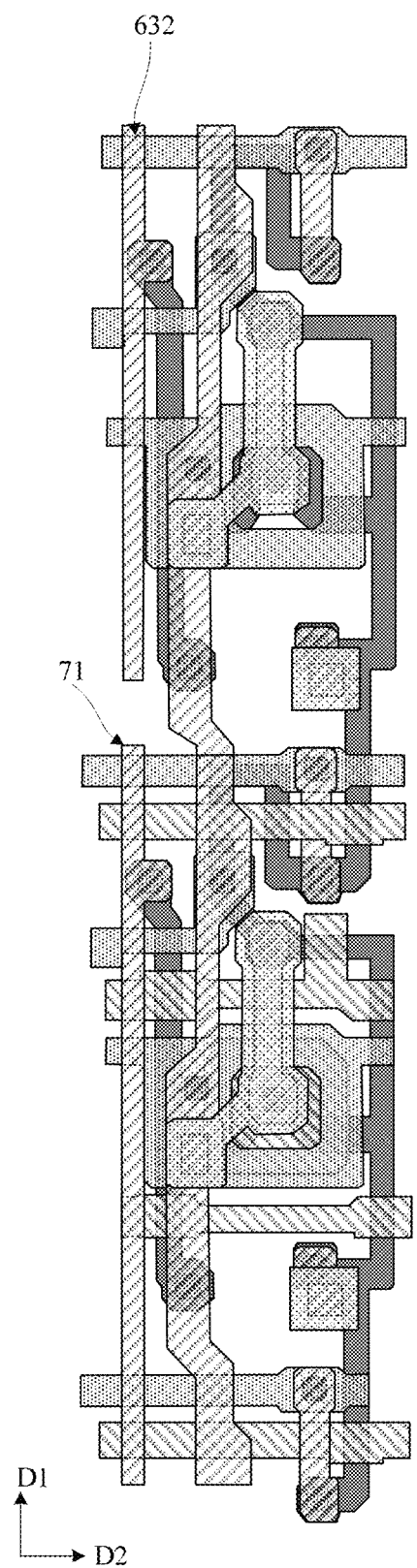
FIG. 8C is a schematic diagram of a cutoff position of a second line segment of a third sub-data line according to at least one embodiment of the present disclosure.

FIG. 8C is a schematic diagram of a cutoff position of a second line segment of a third sub-data line according to at least one embodiment of the present disclosure. In some exemplary embodiments, as shown in FIG. 8C, after being connected with the second line segment 632 through the fourth via F4, the second line segment 632 of the third sub-data line 63 may extend along the first direction D1 until it is cut off at a certain position. Remaining second pixel circuits in a same column as a second pixel circuit connected with the second line segment 632 may be connected with a second data line 71, and the second line segment 632 and the second data line 71 are disconnected. However, this embodiment is not limited thereto.

Figure 8D:
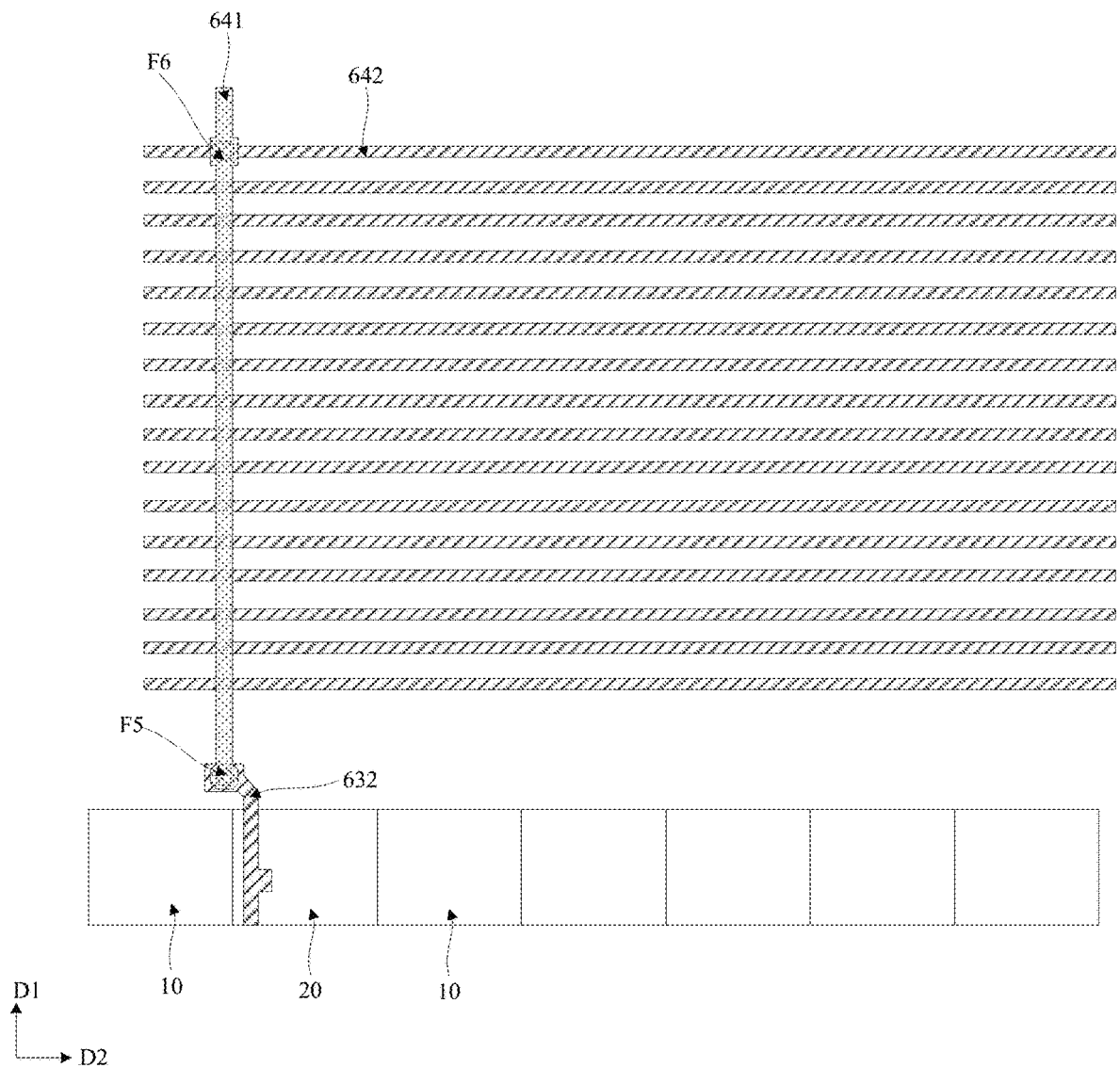
FIG. 8D is a schematic diagram of a connection between a third sub-data line and a data connection line according to at least one embodiment of the present disclosure.
Figure 8E:
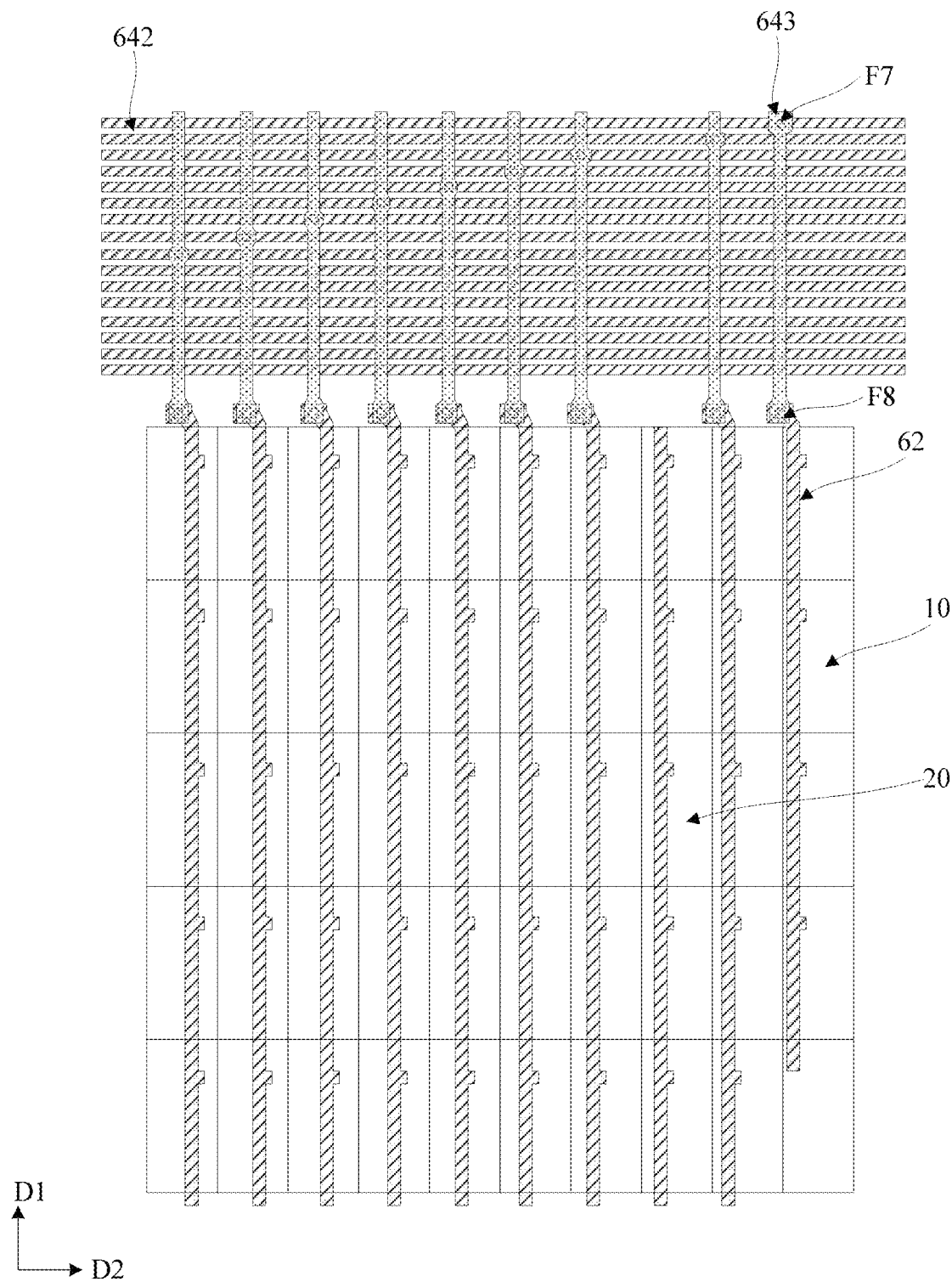
FIG. 8E is a schematic diagram of a connection between a second sub-data line and a data connection line according to at least one embodiment of the present disclosure.

FIG. 8D is a schematic diagram of a connection between a third sub-data line and a data connection line according to at least one embodiment of the present disclosure. FIG. 8E is a schematic diagram of a connection between a second sub-data line and a data connection line according to at least one embodiment of the present disclosure.

In some exemplary embodiments, as shown in FIG. 8D and FIG. 8E, one end of the second line segment 632 of the third sub-data line 63 extends along the first direction D1 to a bezel region adjacent to the third sub-display region (e.g., the third sub-display first sub-region R13a). The first sub-data connection line 641 and the third sub-data connection line 643 may be located in the fourth conductive layer and the second sub-data connection line 642 may be located in the third conductive layer. The second line segment 632 of the third sub-data line 63 may be connected with one end of the first sub-data connection line 641 through a fourth via F5 formed on the fifth insulation layer 55, and the other end of the first sub-data connection line 641 may be connected with one end of the second sub-data connection line 642 through a fourth via F6 formed on the fifth insulation layer 55. The other end of the second sub-data connection line 642 may be connected with one end of the third sub-data connection line 643 through a fourth via F7 formed on the fifth insulation layer 55. The other end of the third sub-data connection line 643 may be connected with one end of the second sub-data line 62 extending to the bezel region through a fourth via F8 formed on the fifth insulation layer 55.

In some exemplary embodiments, as shown in FIG. 8D and FIG. 8E, multiple second sub-data connection lines 642 each extend along the second direction D2 and are sequentially arranged along the first direction D1. The multiple second sub-data connection lines 642 may have a same length along the second direction D2. Multiple first sub-data connection lines 641 and multiple third sub-data connection lines 643 each extend along the first direction D1. The multiple first sub-data connection lines 641 are sequentially arranged along the second direction D2 and the multiple third sub-data connection lines 643 are sequentially arranged along the second direction D2. Lengths of the multiple first sub-data connection lines 641 and the multiple third sub-data connection lines 643 along the first direction D1 may be substantially the same. However, this embodiment is not limited thereto.

In some exemplary embodiments, as shown in FIG. 8E, multiple first pixel circuits 10 and multiple second pixel circuits 20 are provided in a second sub-display region (e.g. a second sub-display first sub-region R12a). A column of second pixel circuits 20 shown in FIG. 8E is used as dummy pixel circuits, which are not connected with a second light emitting element in a second display region R2 and no data signal is required. In this example, in the second sub-display region, a second sub-data connection line 62 connected with a first pixel circuit 10 is connected with a second sub-data connection line 642 through a third sub-data connection line 643 to receive a data signal. However, this embodiment is not limited thereto. In some examples, when a column of second pixel circuits 20 shown in FIG. 8E is connected with a second light emitting element of the second display region R2, a data line connected with the column of second pixel circuits 20 may also be connected with a second sub-data connection line 642 through a third sub-data connection line 643 to receive a data signal.

Exemplary description is given below through a preparation process of a display substrate. A "patterning process" mentioned in the present disclosure includes photoresist coating, mask exposure, development, etching, photoresist stripping, and another treatment for a metal material, an inorganic material, or a transparent conductive material, and includes organic material coating, mask exposure, development, and another treatment for an organic material. Any one or more of sputtering, evaporation, and chemical vapor deposition may be used for deposition, any one or more of spray coating, spin coating, and inkjet printing may be used for coating, and any one or more of dry etching and wet etching may be used for etching, which are not limited in the present disclosure. A "thin film" refers to a layer of thin film made of a material on a base substrate through deposition, coating, or another process. If the "thin film" does not need a patterning process in an entire preparation process, the "thin film" may also be called a "layer". If the "thin film" needs the patterning process in the entire preparation process, the "thin film" is called a "thin film" before the patterning process and is called a "layer" after the patterning process. The "layer" which has experienced the patterning process includes at least one "pattern".

"A and B being arranged on a same layer" mentioned in the present disclosure means that A and B are formed simultaneously through a single patterning process, and a "thickness" of a film layer is a dimension of the film layer in a direction perpendicular to a display substrate. In an exemplary embodiment of the present disclosure, "an orthographic projection of B is within a range of an orthographic projection of A" means that a boundary of the orthographic projection of B falls within a range of a boundary of the orthographic projection of A, or the boundary of the orthographic projection of A is overlapped with the boundary of the orthographic projection of B. "An orthographic projection of A including an orthographic projection of B" means that a boundary of the orthographic projection of B falls within a range of a boundary of the orthographic projection of A, or the boundary of the orthographic projection of A is overlapped with the boundary of the orthographic projection of B.

In some exemplary embodiments, a preparation process of a display substrate may include following operations.

(1) A pattern of a semiconductor layer is formed.

In some exemplary embodiments, forming the pattern of the semiconductor layer may include: depositing a first insulation thin film and a semiconductor thin film sequentially on a base substrate 50, patterning the semiconductor thin film through a patterning process to form a first insulation layer 51 covering the base substrate 50 and a semiconductor layer disposed on the first insulation layer, as shown in FIG. 7C.

After this process, the display substrate includes the first insulation layer 51 disposed on the base substrate 50 and the semiconductor layer disposed on the first insulation layer 51. The semiconductor layer may include active layers of multiple transistors of a pixel circuit. In this exemplary embodiment, an active layer of a second reset transistor of a pixel circuit and an active layer of a first reset transistor of an adjacent pixel circuit may be of an integral structure.

(2) A pattern of a first conductive layer is formed.

In some exemplary embodiments, forming the pattern of the first conductive layer may include: depositing a second insulation thin film and a first metal thin film sequentially on the base substrate 50 formed with the aforementioned pattern, and patterning the first metal thin film through a patterning process to form a second insulation layer 52 covering the pattern of the semiconductor layer and the pattern of the first conductive layer disposed on the second insulation layer 52. As shown in FIG. 7D, the pattern of the first conductive layer may include gates of multiple transistors of a pixel circuit, a first reset control line RST1, a scan line GL, an emitting control line EML, a first electrode Cst-1 of a storage capacitor Cst, and a second reset control line RST2. The first reset control line RST1, the second reset control line RST2, the scan line GL, and the emitting control line EML extend along a second direction D2, and the first electrode Cst-1 of the storage capacitor Cst is located between the scan line GT and the emitting control line EML.

In some examples, the first conductive layer may be referred to as a first gate metal (GATE 1) layer.

In some exemplary embodiments, after the pattern of the first conductive layer is formed, the first conductive layer may be used as a shield to perform a conductive treatment on the semiconductor layer. The semiconductor layer in a region shielded by the first conductive layer forms channel regions of multiple transistors, and the semiconductor layer in a region not shielded by the first conductive layer is made to be conductive, that is, first regions and second regions of a first active layer T10 to a seventh active layer T70 are all made to be conductive.

(3) A pattern of a second conductive layer is formed.

In some exemplary embodiments, forming the pattern of the second conductive layer may include: depositing a third insulation thin film and a second metal thin film sequentially on the base substrate 50 formed with the aforementioned patterns, and patterning the second metal thin film through a patterning process to form a third insulation layer 53 covering the first conductive layer and the pattern of the second conductive layer arranged on the third insulation layer 53. As shown in FIG. 7E, the pattern of the second conductive layer may include a first initial signal line INIT1, a second initial signal line INIT2, a second electrode Cst-2 of the storage capacitor Cst, and a first shield electrode SE1. In some examples, the second conductive layer may be referred to as a second gate metal (GATE 2) layer.

(4) A pattern of a fourth insulation layer is formed.

In some exemplary embodiments, forming the pattern of the fourth insulation layer may include: depositing a fourth insulation thin film on the base substrate 50 formed with the aforementioned patterns, and patterning the fourth insulation thin film through a patterning process to form the fourth insulation layer 54 covering the second conductive layer. As shown in FIG. 7F, multiple first vias H1, multiple second vias V1 to V3, and multiple third vias K1 to K6 are disposed on the fourth insulation layer. The fourth insulation layer 54 and the third insulation layer 53 in the multiple first vias are etched away to expose a surface of the first conductive layer, the fourth insulation layer 54 in the multiple second vias is etched away to expose a surface of the second conductive layer, and the fourth insulation layer 54, the third insulation layer 53, and the second insulation layer 52 in the multiple third vias are etched away to expose a surface of the semiconductor layer.

(5) A pattern of a third conductive layer is formed.

In some exemplary embodiments, forming the third conductive layer may include: depositing a third metal thin film on the base substrate 50 formed with the aforementioned patterns, and patterning the third metal thin film through a patterning process to form the third conductive layer on the fourth insulation layer 54. As shown in FIG. 7F, FIG. 8D, and FIGS. 8E, the third conductive layer may include a second data line 71 located in a first display region R1, a first sub-data line 61, a second sub-data line 62, a second line segment 632 of the third sub-data line 63, a first power supply line PL1, first electrodes and second electrodes of multiple transistors of a pixel circuit, and a second sub-data connection line 642 located in a bezel region R3. In some examples, the third conductive layer is referred to as a first source drain metal (SD1) layer.

(6) A pattern of a fifth insulation layer is formed.

In some exemplary embodiments, forming the pattern of the fifth insulation layer may include: coating a planarization thin film on the base substrate 50 formed with the aforementioned patterns, and patterning the planarization thin film through a patterning process to form a fifth insulation layer 55 covering the third conductive layer, as shown in FIG. 7G. Multiple fourth vias F1 to F8 are formed on the fifth insulation layer 55. The fifth insulation layer 55 in the multiple fourth vias is etched away to expose a surface of the third conductive layer. In some examples, the fifth insulation layer 55 may be referred to as a planarization layer.

(7) A pattern of a fourth conductive layer is formed.

In some exemplary embodiments, forming the pattern of the fourth conductive layer may include: depositing a fourth metal thin film on the base substrate 50 formed with the aforementioned patterns, patterning the fourth metal thin film through a patterning process to form the fourth conductive layer disposed on the fifth insulation layer 55.

As shown in FIG. 7G, the pattern of the fourth conductive layer may include a first connection electrode CE1 located in the first display region R1, a second shield electrode SE, a first line segment 631 of the third sub-data line 63, and a first sub-data connection line 641 and a third sub-data connection line 643 located in the bezel region R3. The second shield electrode SE is connected with the first power supply line PL1 through a fourth via F2, and the first connection electrode CE1 is connected with the second electrode T62 of the second emitting control transistor T6 through a fourth via F1. The first line segment 631 of the third sub-data line 63 is connected with the first sub-data line 61 through a fourth via F3 and with the second line segment 632 of the third sub-data line 63 through a fourth via F4. The first sub-data connection line 641 is connected with the second line segment 632 through a fourth via F5 and with the second sub-data connection line 642 through a fourth via F6. The third sub-data connection line 643 is connected with the second sub-data connection line 642 through a fourth via F7 and with the second sub-data line 62 through a fourth via F8. In some examples, the fourth conductive layer may be referred to as a second source drain metal (SD2) layer.

In some exemplary embodiments, a subsequent preparation process may include: forming a conductive line layer. In some examples, multiple conductive lines connecting second pixel circuits of a first display region and second light emitting elements of a second display region may be of a same-layer structure. The forming the conductive line layer may include: coating a planarization thin film on the base substrate formed with the fourth conductive layer, patterning the planarization thin film through a patterning process to form a sixth insulation layer covering the fourth conductive layer; then depositing a transparent conductive thin film, and patterning the transparent conductive thin film through a patterning process to form a conductive line layer disposed on the sixth insulation layer. A first connection electrode CE1 of a second pixel circuit of a first display region R1 is connected with a conductive line which may extend from the first display region R1 to a second display region R2, so as to be connected with a second light emitting element of the second display region R2. However, this embodiment is not limited thereto. In some examples, multiple conductive lines connecting second pixel circuits of the first display region R1 and second light emitting elements of the second display region R2 may be of a different-layer structure. Or, at least one conductive line may be formed by connecting multiple conductive line segments located in different conductive line layers.

In some exemplary embodiments, a preparation process after the conductive line layer is formed may include: forming a planarization layer covering the conductive line layer; depositing a transparent conductive thin film, patterning the transparent conductive thin film through a patterning process to form an anode disposed on the planarization layer; coating a pixel definition thin film, and patterning the pixel definition thin film through a patterning process to form a pixel definition layer, wherein a pixel definition layer of each sub-pixel is disposed with a pixel opening, and the pixel opening exposes the anode. An organic light emitting layer is formed using an evaporation or ink-jet printing process, and a cathode is formed on the organic light emitting layer. An encapsulation layer is formed, and the encapsulation layer may include a first encapsulation layer, a second encapsulation layer, and a third encapsulation layer stacked, the first encapsulation layer and the third encapsulation layer may be made of an inorganic material, the second encapsulation layer may be made of an organic material, and the second encapsulation layer is disposed between the first encapsulation layer and the third encapsulation layer to ensure that external water vapor cannot enter a light emitting element.

In some exemplary embodiments, the base substrate 50 may be a flexible base substrate or a rigid base substrate. The rigid substrate may be made of, but is not limited to, one or more of glass and quartz. The flexible substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In some examples, the flexible base substrate may include a first flexible material layer, a first inorganic material layer, a semiconductor layer, a second flexible material layer, and a second inorganic material layer stacked, materials of the first flexible material layer and the second flexible material layer may be Polyimide (PI), Polyethylene Terephthalate (PET), or a polymer soft film after a surface treatment, etc.; materials of the first inorganic material layer and the second inorganic material layer may be Silicon Nitride (SiNx) or Silicon Oxide (SiOx), etc., for improving capabilities of water-resistance and oxygen-resistance of the base substrate; and a material of the semiconductor layer may be amorphous silicon (a-si).

In some exemplary embodiments, the first conductive layer, the second conductive layer, the third conductive layer, and the fourth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be in a single-layer structure, or a multilayer composite structure such as Mo/Cu/Mo. The first insulation layer 51, the second insulation layer 52, the third insulation layer 53, and the fourth insulation layer 54 may be made of any one or more of Silicon Oxide (SiOx), Silicon Nitride (SiNx), and Silicon Oxynitride (SiON), and may be a single layer, a multiple layer, or a composite layer. The first insulation layer 51 is referred to as a buffer layer, which is used for improving capabilities of water-resistance and oxygen-resistance of the base substrate. The second insulation layer 52 and the third insulation layer 53 are referred to as Gate Insulators (GIs). The fourth insulation layer 54 is referred to as an Interlayer Dielectric (ILD) layer. A planarization layer may be made of an organic material. A transparent conductive thin film may be made of Indium Tin Oxide (ITO) or Indium Zinc Oxide (IZO). An active layer may be made of poly-Silicon (p-Si), that is, an LTPS thin film transistor is suitable for this embodiment. However, this embodiment is not limited thereto. For example, transistors in a pixel circuit may all be oxide thin film transistors.

Description of a structure and a preparation process of a display substrate of this embodiment is merely illustrative.

In some exemplary embodiments, changes in corresponding structures and, addition or deletion of patterning processes may be made according to actual needs. For example, a second reset transistor in a pixel circuit may be connected with a second initial signal line. For example, a pixel circuit may include other numbers of transistors and storage capacitors, such as a 7T2C structure, a 6T1C structure, a 6T2C structure, or a 9T2C structure, or a quantity of transistors is less than seven. For example, the first sub-data line, the second sub-data line, the second data line, the second line segment of the third sub-data line, and the second sub-data connection line may be located in the fourth conductive layer; and the first line segment of the third sub-data line, the first sub-data connection line, and the third sub-data connection line may be located in the third conductive layer. However, this embodiment is not limited thereto.

The structure (or method) shown in this embodiment may be combined with structures (or methods) shown in other embodiments as appropriate.

Figure 9:
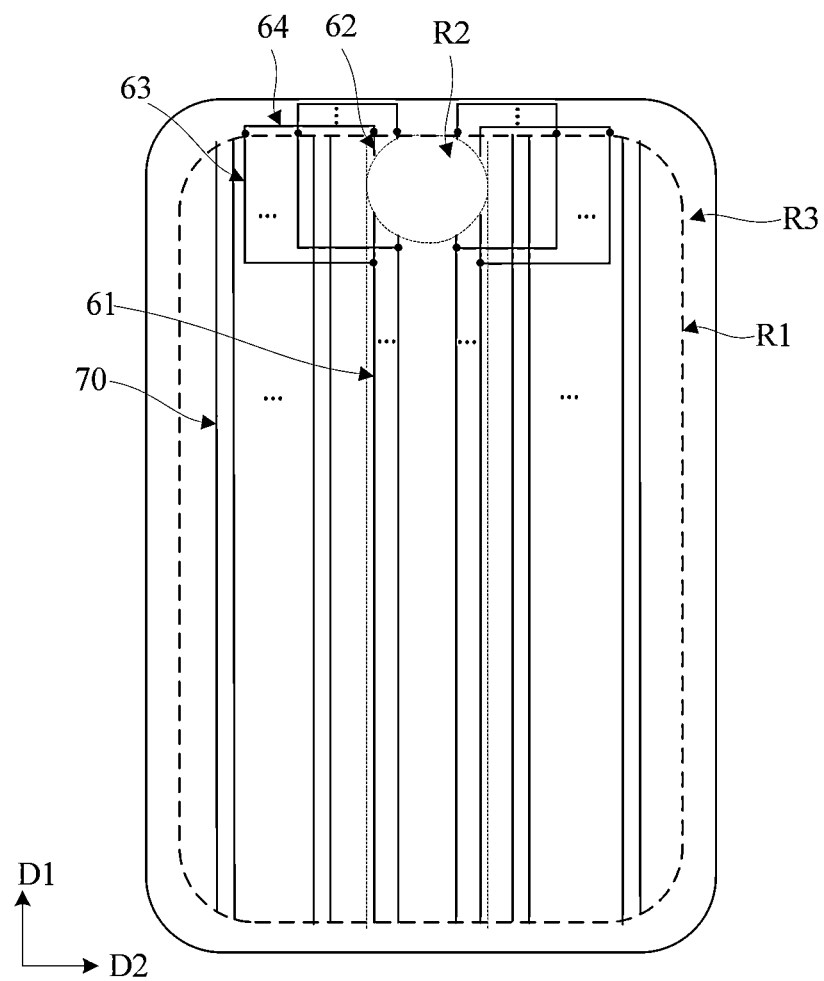
FIG. 9 is a schematic diagram of another layout of data lines of a display substrate according to at least one embodiment of the present disclosure.

FIG. 9 is another schematic diagram of data lines of a display substrate according to at least one embodiment of the present disclosure. In some exemplary embodiments, as shown in FIG. 9, the first line segment and the second line segment of the third sub-data line 63 have an integral structure. The first sub-data connection line, the second sub-data connection line, and the third sub-data connection line of the data connection line 64 may have an integral structure. The data connection line 64 is connected between the third sub-data line 63 and the second sub-data line 62, and the third sub-data line 63 is connected with the first sub-data line 61. In some examples, the first sub-data line 61 and the data connection line 64 may be located in the third conductive layer, and the third sub-data line 63 and the second sub-data line 62 may be located in the fourth conductive layer. However, this embodiment is not limited thereto.

For the rest of the structure of the display substrate of this embodiment, reference may be made to descriptions of the aforementioned embodiments, and thus will not be repeated here. The structure (or method) shown in this embodiment may be combined with structures (or methods) shown in other embodiments as appropriate.

Figure 10:
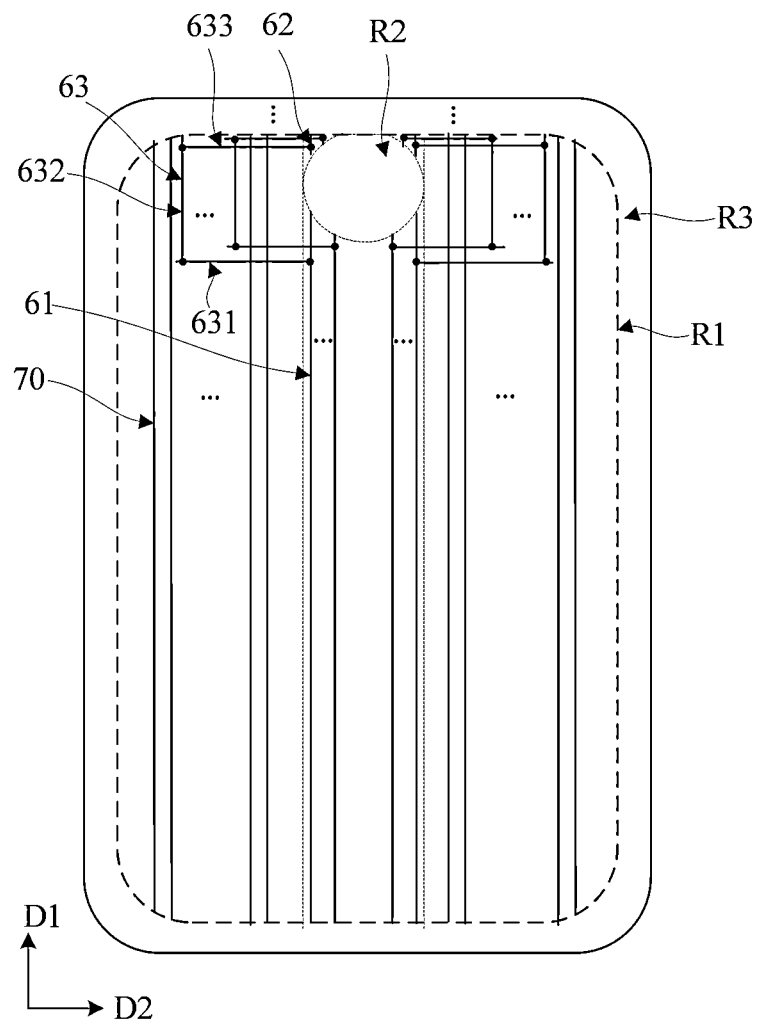
FIG. 10 is a schematic diagram of another layout of data lines of a display substrate according to at least one embodiment of the present disclosure.

FIG. 10 is a schematic diagram of another layout of data lines of a display substrate according to at least one embodiment of the present disclosure. In some exemplary embodiments, as shown in FIG. 10, the third sub-data line 63 includes a first line segment 631, a second line segment 632, and a third line segment 633. The second line segment 632 is connected with multiple second pixel circuits disposed along a first direction D1 of the third sub-display region. The second line segment 632 is connected with the first line segment 631 and the third line segment 633 respectively. The first line segment 631 and the third line segment 633 extend along a second direction D2, and the second line segment 632 extends along the first direction D1. The first line segment 631 extends to the first sub-display region R11 and is connected with the first sub-data line 61 of the first sub-display region R11. The third line segment 632 extends to the second sub-display region R12*a* and is connected with the second sub-data line 62 of the second sub-display region R12*a*. In some examples, the first sub-data line 61, the second sub-data line 62, and the second line segment 632 may be located in the third conductive layer and the first line segment 631 and the third line segment 633 may be located in the fourth conductive layer. However, this embodiment is not limited thereto.

For the rest of the structure of the display substrate of this embodiment, reference may be made to descriptions of the aforementioned embodiments, and thus will not be repeated here. The structure (or method) shown in this embodiment may be combined with structures (or methods) shown in other embodiments as appropriate.

Figure 11:
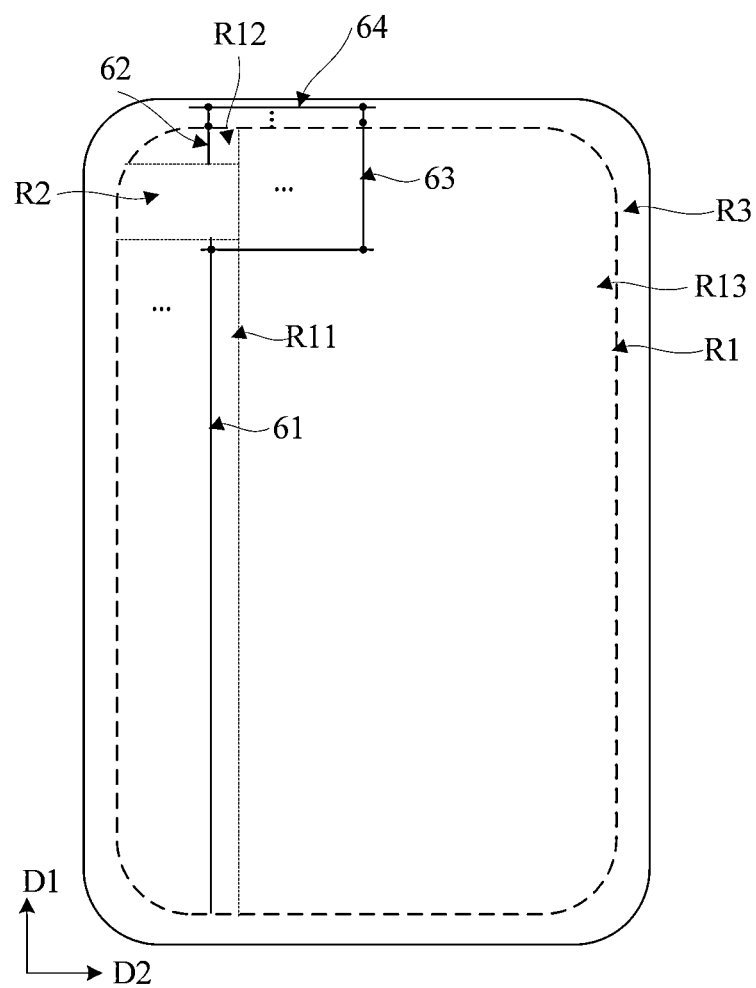
FIG. 11 is another schematic diagram of a display substrate according to at least one embodiment of the present disclosure.

FIG. 11 is another schematic diagram of a display substrate according to at least one embodiment of the present disclosure. In some exemplary embodiments, as shown in FIG. 11, the second display region R2 is located in a left half of the display substrate. The first display region R1 includes a first sub-display region R11, a second sub-display region R12, and a third sub-display region R13. The first sub-display region R11 and the second sub-display region R12 are located on opposite sides of the second display region R2 along a first direction D1. The first sub-display region R11 and the second sub-display region R12 are separated by the second display region R2 in the first direction D1. The third sub-display region R13 is located on one side of the second display region R2, for example, on a right side of the second display region R2. The first sub-data line 61 of the first sub-display region R11 may be connected with the second sub-data line 62 of the second sub-display region R12 through the third sub-data line 63 of the third sub-display region R13 and the data connection line 64 of the bezel region R3, so as to achieve supply of a data signal to a pixel circuit (e.g., a first pixel circuit, or a first pixel circuit and a second pixel circuit) of the second sub-display region R12.

For the rest of the structure of the display substrate of this embodiment, reference may be made to descriptions of the aforementioned embodiments, and thus will not be repeated here. The structure (or method) shown in this embodiment may be combined with structures (or methods) shown in other embodiments as appropriate.

Figure 12:
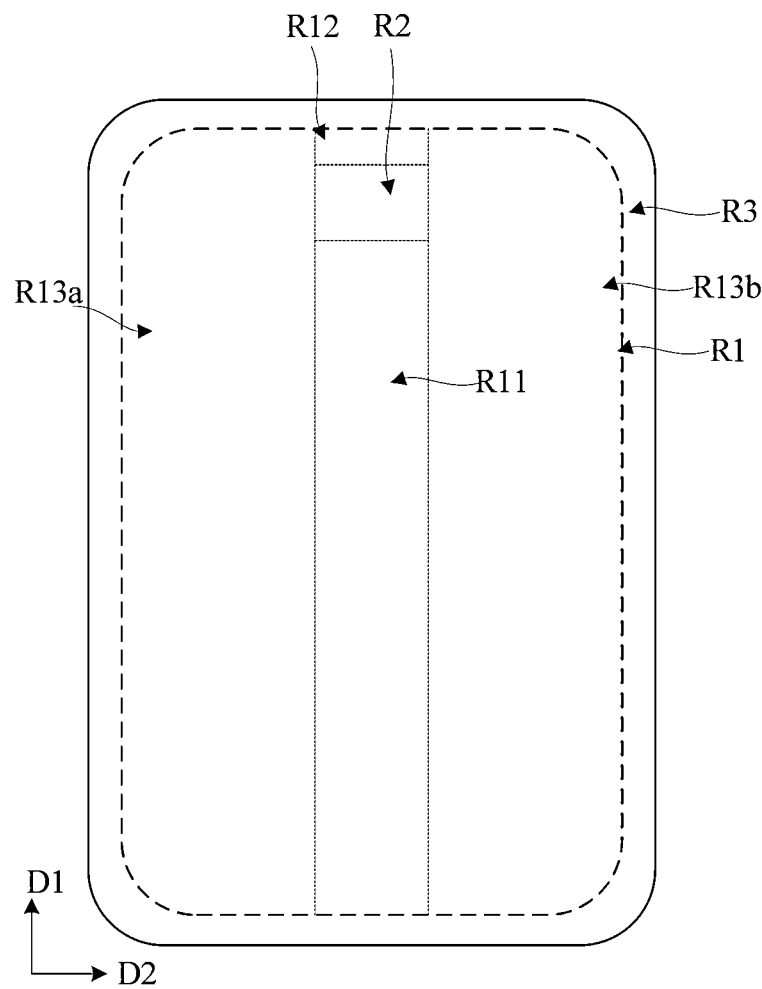
FIG. 12 is another schematic diagram of a display substrate according to at least one embodiment of the present disclosure.

FIG. 12 is another schematic diagram of a display substrate according to at least one embodiment of the present disclosure. In some exemplary embodiments, as shown in FIG. 12, the second display region R2 may be rectangular and is located in a central region of the display substrate. The first display region R1 includes: a first sub-display region R11 and a second sub-display region R12 located on opposite sides of the second display region R2 in a first direction D1, and a third sub-display region located on opposite sides of the second display region R2 in a second direction D2. The third sub-display region includes a third sub-display first sub-region R13a and a third sub-display second sub-region R13b.

For the rest of the structure of the display substrate of this embodiment, reference may be made to descriptions of the aforementioned embodiments, and thus will not be repeated here. The structure (or method) shown in this embodiment may be combined with structures (or methods) shown in other embodiments as appropriate.

An embodiment of the present disclosure further provides a preparation method of a display substrate, including: forming multiple pixel circuits, multiple first light emitting elements, and at least one first data line in a first display region of a base substrate. The first display region at least partially surrounds a second display region. The first display region includes: a first sub-display region and a second sub-display region located on opposite sides of the second display region along a first direction, and a third sub-display region located on at least one side of the second display region along a second direction. The first direction and the second direction intersect. The multiple pixel circuits include multiple first pixel circuits and multiple second pixel circuits, wherein the multiple second pixel circuits are distributed among the multiple first pixel circuits. At least one pixel circuit of the multiple first pixel circuits is connected with at least one light emitting element of the multiple first light emitting elements. The first data line includes a first sub-data line, a second sub-data line, and a third sub-data line; wherein the third sub-data line is connected with the first sub-data line and the second sub-data line. The first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region.

For the preparation method of the display substrate in this embodiment, reference may be made to descriptions of the aforementioned embodiments, and thus will not be repeated here.

Figure 13:
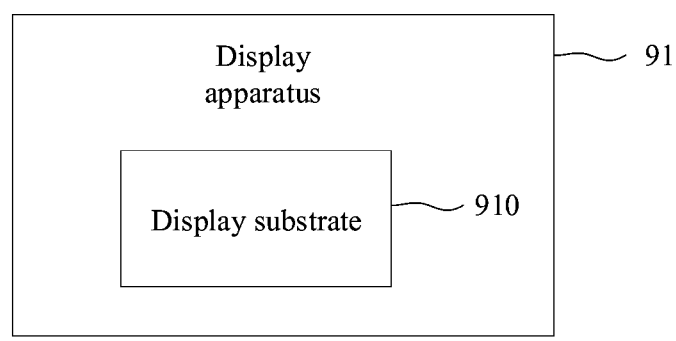
FIG. 13 is a schematic diagram of a display apparatus according to at least one embodiment of the present disclosure.

FIG. 13 is a schematic diagram of a display apparatus according to at least one embodiment of the present disclosure. As shown in FIG. 13, this embodiment provides a display apparatus 91, which includes a display substrate 910 of the aforementioned embodiments. In some examples, the display substrate 910 may be an OLED display substrate, a QLED display substrate, a Micro-LED display substrate, or a Mini-LED display substrate. The display apparatus 91 may be any product or component with a display function, such as a mobile phone, a tablet computer, a television, a display, a notebook computer, a digital photo frame, and a navigator. However, this embodiment is not limited thereto.

The drawings of the present disclosure only involve the structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
   a base substrate comprising a first display region and a second display region, wherein the first display region at least partially surrounds the second display region, and the first display region comprises: a first sub-display region and a second sub-display region located on opposite sides of the second display region along a first direction, and a third sub-display region located on at least one side of the second display region along a second direction, wherein the first direction intersects the second direction;
   multiple pixel circuits and multiple first light emitting elements located in the first display region; wherein the multiple pixel circuits comprise multiple first pixel circuits and multiple second pixel circuits, the multiple second pixel circuits are distributed among the multiple first pixel circuits, and at least one pixel circuit of the multiple first pixel circuits is connected with at least one light emitting element of the multiple first light emitting elements;
   at least one first data line located in the first display region; wherein the first data line comprises a first sub-data line, a second sub-data line, and a third sub-data line, the third sub-data line is connected with the first sub-data line and the second sub-data line; and the first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region, further comprising:

multiple second light emitting elements located in the second display region; and at least one pixel circuit of the multiple second pixel circuits connected with at least one light emitting element of the multiple second light emitting elements through a conductive line.

2. The display substrate according to claim 1, wherein the first sub-data line and the second sub-data line each extend along the first direction.

3. The display substrate according to claim 2, wherein the third sub-data line at least comprises: a first line segment and a second line segment, the first line segment extends along the second direction, and the second line segment extends along the first direction;

one end of the first line segment extends to the first sub-display region and is connected with the first sub-data line, and the other end of the first line segment is connected with the second line segment; and the second line segment is connected with at least one second pixel circuit of the third sub-display region.

4. The display substrate according to claim 2, wherein the first sub-data line and the second sub-data line are of a same-layer structure, and the third sub-data line and the first sub-data line are of a different-layer structure.

5. The display substrate according to claim 2, wherein the base substrate further comprises a bezel region located at a periphery of the first display region and the second display region; and the bezel region is provided with at least one data connection line, and the data connection line is connected between the third sub-data line and the second sub-data line.

6. The display substrate according to claim 2, wherein in a plane perpendicular to the display substrate, the display substrate at least comprises a semiconductor layer, a first conductive layer, a second conductive layer, and a third conductive layer, and a fourth conductive layer that are disposed on the base substrate;

the semiconductor layer at least comprises active layers of multiple transistors of a pixel circuit;

the first conductive layer at least comprises gates of the multiple transistors and a first electrode of a storage capacitor of the pixel circuit;

the second conductive layer at least comprises a second electrode of the storage capacitor of the pixel circuit;

the third conductive layer at least comprises a first power supply line; and the fourth conductive layer at least comprises a first connection electrode connecting the pixel circuit and a light emitting element.

7. The display substrate according to claim 1, wherein the third sub-data line at least comprises: a first line segment and a second line segment, the first line segment extends along the second direction, and the second line segment extends along the first direction;

one end of the first line segment extends to the first sub-display region and is connected with the first sub-data line, and the other end of the first line segment is connected with the second line segment; and the second line segment is connected with at least one second pixel circuit of the third sub-display region.

8. The display substrate according to claim 7, wherein the first sub-data line, the second sub-data line, and the second line segment of the third sub-data line are of a same-layer structure, and the first line segment and the second line segment of the third sub-data line are of a different-layer structure.

9. The display substrate according to claim 1, wherein the first sub-data line and the second sub-data line are of a same-layer structure, and the third sub-data line and the first sub-data line are of a different-layer structure.

10. The display substrate according to claim 1, wherein the base substrate further comprises a bezel region located at a periphery of the first display region and the second display region; and the bezel region is provided with at least one data connection line, and the data connection line is connected between the third sub-data line and the second sub-data line.

11. The display substrate according to claim 10, wherein the data connection line at least comprises: a first sub-data connection line, a second sub-data connection line, and a third sub-data connection line; and the second sub-data connection line is connected between the first sub-data connection line and the third sub-data connection line, the first sub-data connection line is connected with the third sub-data line, and the third sub-data connection line is connected with the second sub-data line.

12. The display substrate according to claim 11, wherein the first sub-data connection line and the third sub-data connection line extend along the first direction and the second sub-data connection line extends along the second direction.

13. The display substrate according to claim 11, wherein the first sub-data connection line and the third sub-data connection line are of a same-layer structure, and the first sub-data connection line and the second sub-data connection line are of a different-layer structure.

14. The display substrate according to claim 13, wherein the second sub-data connection line, and the first sub-data line and the second sub-data line are of a same-layer structure.

15. The display substrate according to claim 1, wherein in a plane perpendicular to the display substrate, the display substrate at least comprises a semiconductor layer, a first conductive layer, a second conductive layer, and a third conductive layer, and a fourth conductive layer that are disposed on the base substrate;

the semiconductor layer at least comprises active layers of multiple transistors of a pixel circuit;

the first conductive layer at least comprises gates of the multiple transistors and a first electrode of a storage capacitor of the pixel circuit;

the second conductive layer at least comprises a second electrode of the storage capacitor of the pixel circuit;

the third conductive layer at least comprises a first power supply line; and the fourth conductive layer at least comprises a first connection electrode connecting the pixel circuit and a light emitting element.

16. The display substrate according to claim 15, wherein the first sub-data line, the second sub-data line, and a second line segment of the third sub-data line are located in the third conductive layer, and a first line segment of the third sub-data line is located in the fourth conductive layer; or, the first sub-data line and the second sub-data line are located in the third conductive layer, and the third sub-data line is located in the fourth conductive layer.

17. A display apparatus, comprising a display substrate according to claim 1.

18. A preparation method of a display substrate, comprising:
forming multiple pixel circuits, multiple first light emitting elements, and at least one first data line in a first display region of a base substrate;
wherein the first display region at least partially surrounds a second display region; the first display region comprises: a first sub-display region and a second sub-display region located on opposite sides of the second display region along a first direction, and a third sub-display region located on at least one side of the second display region along a second direction, the first direction intersects the second direction; the multiple pixel circuits comprise multiple first pixel circuits and multiple second pixel circuits, the multiple second pixel circuits are distributed among the multiple first pixel circuits; at least one pixel circuit of the multiple first pixel circuits is connected with at least one light emitting element of the multiple first light emitting elements; the first data line comprises a first sub-data line, a second sub-data line, and a third sub-data line; the third sub-data line is connected with the first sub-data line and the second sub-data line; the first sub-data line is located in the first sub-display region and is connected with a pixel circuit of the first sub-display region, the second sub-data line is located in the second sub-display region and is connected with a pixel circuit of the second sub-display region, and the third sub-data line is located in the third sub-display region and is connected with at least one second pixel circuit of the third sub-display region,
wherein the second display region comprises multiple second light emitting elements; and
at least one pixel circuit of the multiple second pixel circuits is connected with at least one light emitting element of the multiple second light emitting elements through a conductive line.

\* \* \* \* \*